US011617140B2

(12) United States Patent
Cherian et al.

(10) Patent No.: US 11,617,140 B2
(45) Date of Patent: Mar. 28, 2023

(54) TECHNIQUES FOR MANAGING A SHARED LOW NOISE AMPLIFIER AUTOMATIC GAIN CONTROL IN DUAL SIM DUAL ACTIVE DEPLOYMENTS

(71) Applicant: QUALCOMM Incorporated, San Diego, CA (US)

(72) Inventors: Vineet Cherian, Carlsbad, CA (US); Thawatt Gopal, San Diego, CA (US); Tsai-Chen Huang, Mountain View, CA (US); Ketan Humnabadkar, San Jose, CA (US); Rimal Patel, San Diego, CA (US); Reza Shahidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 17/348,070

(22) Filed: Jun. 15, 2021

(65) Prior Publication Data
US 2022/0312347 A1    Sep. 29, 2022

Related U.S. Application Data

(60) Provisional application No. 63/165,081, filed on Mar. 23, 2021.

(51) Int. Cl.
H04W 52/52 (2009.01)
H04W 72/04 (2023.01)
(Continued)

(52) U.S. Cl.
CPC ......... *H04W 52/52* (2013.01); *H04W 52/281* (2013.01); *H04W 72/04* (2013.01); *H04W 88/06* (2013.01)

(58) Field of Classification Search
CPC ... H04W 52/52; H04W 52/281; H04W 72/04; H04W 88/06
(Continued)

(56) References Cited

U.S. PATENT DOCUMENTS 8,781,442 B1\* 7/2014 Link, II .................... H04L 9/30
                                                   370/338
9,112,672 B2\* 8/2015 Chizgi .................. H04L 1/0091
(Continued)

FOREIGN PATENT DOCUMENTS

EP    3272009 A1    1/2018

OTHER PUBLICATIONS

Partial International Search Report—PCT/US2022/017684—ISA/EPO—dated Jun. 9, 2022 (2103412WO).
(Continued)

*Primary Examiner* — Hai V Nguyen
(74) *Attorney, Agent, or Firm* — Lei Dong; Holland & Hart LLP

(57) ABSTRACT

Methods, systems, and devices for wireless communications are described. In some systems, a user equipment (UE) may support multi-subscriber identity module (SIM) operation in dual SIM dual active (DSDA) deployments. In some aspects, the UE may receive, via an antenna of the UE, a first signal associated with a first network subscription on a first receive path of the antenna and a second signal associated with a second network subscription on a second receive path of the antenna. The UE may determine a signal strength for each of the first signal and the second signal, determine a first gain for the first receive path and a gain for a low noise amplifier (LNA) coupled with the antenna based on the signal strength of the first signal, and determine a gain for the second receive path based on the signal strength of the second signal and the gain of the LNA.

30 Claims, 18 Drawing Sheets

(51) Int. Cl.
*H04W 52/28* (2009.01)
*H04W 88/06* (2009.01)

(58) Field of Classification Search
USPC .......................................................... 455/522
See application file for complete search history.

(56) References Cited

U.S. PATENT DOCUMENTS

| | | | | |
|---|---|---|---|---|
| 9,172,414 | B2* | 10/2015 | Li | H04B 1/525 |
| 9,237,593 | B2* | 1/2016 | Kirveskoski | H04W 76/15 |
| 10,111,119 | B2* | 10/2018 | Dev | H04W 24/08 |
| 10,334,558 | B2* | 6/2019 | Gopal | H04W 72/06 |
| 10,420,161 | B1 | 9/2019 | Sava et al. | |
| 10,505,700 | B1* | 12/2019 | Lan | H04B 1/525 |
| 10,511,988 | B2* | 12/2019 | Astrom | H04W 28/0205 |
| 10,523,246 | B1* | 12/2019 | Zhang | H04B 7/0686 |
| 10,727,800 | B2* | 7/2020 | Kajakine | H03G 3/3078 |
| 10,863,565 | B2* | 12/2020 | Lindoff | H04W 8/183 |
| 2007/0101122 | A1* | 5/2007 | Guo | H04L 9/0844 |
| | | | | 713/153 |
| 2011/0280166 | A1* | 11/2011 | Nien | H04W 76/19 |
| | | | | 370/310 |
| 2012/0327912 | A1* | 12/2012 | Kirveskoski | H04W 76/15 |
| | | | | 455/434 |
| 2013/0316764 | A1* | 11/2013 | Mehio | H04W 8/183 |
| | | | | 455/558 |
| 2013/0339864 | A1* | 12/2013 | Uusitalo | H04W 48/18 |
| | | | | 715/736 |
| 2014/0169273 | A1* | 6/2014 | Chizgi | H04L 1/0039 |
| | | | | 370/328 |
| 2014/0213210 | A1* | 7/2014 | Li | H04B 1/12 |
| | | | | 455/296 |
| 2014/0213235 | A1* | 7/2014 | Lou | H04B 1/525 |
| | | | | 455/418 |
| 2014/0302802 | A1* | 10/2014 | Chang | H04B 3/02 |
| | | | | 307/112 |
| 2015/0080008 | A1* | 3/2015 | Ngai | H04W 88/06 |
| | | | | 455/452.2 |
| 2015/0098532 | A1 | 4/2015 | Ryu et al. | |
| 2016/0014127 | A1* | 1/2016 | Mohebbi | H04W 48/18 |
| | | | | 455/411 |
| 2016/0365879 | A1* | 12/2016 | Soliman | H04B 1/0053 |
| 2017/0127305 | A1* | 5/2017 | Dev | H04W 24/08 |
| 2017/0257750 | A1* | 9/2017 | Gunasekara | H04W 4/90 |
| 2017/0353893 | A1* | 12/2017 | Marwah | H04W 36/0022 |
| 2018/0062602 | A1* | 3/2018 | Kajakine | H03G 3/3078 |
| 2018/0352386 | A1* | 12/2018 | Gunasekara | H04W 4/38 |
| 2018/0368098 | A1* | 12/2018 | Gopal | H04W 76/15 |
| 2019/0069193 | A1* | 2/2019 | Astrom | H04W 52/028 |
| 2019/0274145 | A1* | 9/2019 | Ngai | H04W 52/241 |
| 2020/0084814 | A1* | 3/2020 | Lindoff | H04W 64/00 |
| 2020/0244346 | A1* | 7/2020 | Goettle | H04B 7/0408 |
| 2021/0014819 | A1* | 1/2021 | Oduwaiye | H04W 28/16 |
| 2021/0127351 | A1* | 4/2021 | Stojanovski | H04W 48/16 |
| 2021/0282065 | A1* | 9/2021 | Chin | H04W 40/02 |
| 2021/0400599 | A1* | 12/2021 | Gopal | H04W 52/367 |
| 2022/0053607 | A1* | 2/2022 | Rice | H04W 88/06 |

OTHER PUBLICATIONS

International Search Report and Written Opinion—PCT/US2022/017684—ISA/EPO—dated Sep. 1, 2022 (2103412WO).

* cited by examiner

TECHNIQUES FOR MANAGING A SHARED LOW NOISE AMPLIFIER AUTOMATIC GAIN CONTROL IN DUAL SIM DUAL ACTIVE DEPLOYMENTS

CROSS REFERENCE

The present application for Patent claims the benefit of U.S. Provisional Patent Application No. 63/165,081 by Cherian et al., entitled "TECHNIQUES FOR MANAGING A SHARED LOW NOISE AMPLIFIER AUTOMATIC GAIN CONTROL IN DUAL SIM DUAL ACTIVE DEPLOYMENTS," filed Mar. 23, 2021, assigned to the assignee hereof, and which is hereby incorporated by reference in its entirety.

FIELD OF DISCLOSURE

The following relates to wireless communications, including techniques for managing a shared low noise amplifier (LNA) automatic gain control (AGC) in dual subscriber identity (SIM) dual active (DSDA) deployments.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

In some cases, a UE may be capable of supporting multiple subscriber identity module (SIM) cards, each associated with a unique network subscription, and the UE may communicate with multiple service providers using the multiple SIM cards.

SUMMARY

The present disclosure relates to improved methods, systems, devices, and apparatuses that support techniques for managing a shared low noise amplifier (LNA) automatic gain control (AGC) in dual subscriber identity module (SIM) dual active (DSDA) deployments. For example, in some implementations of the present disclosure, a multi-SIM DSDA UE (e.g., a UE capable of communicating with multiple service providers using multiple network subscriptions in connected modes) may receive signaling associated with a first network subscription and signaling associated with a second network subscription via a same antenna of the UE and may set a gain for a shared LNA (e.g., an external LNA coupled with the antenna) based on a gain state (GS) associated with a priority network subscription. For instance, in examples in which the first network subscription is the priority network subscription, the UE may set the gain for the shared LNA based on using a first GS associated with the first network subscription.

The UE may use the shared LNA for receiving both the signaling associated with the first network subscription and the signaling associated with the second network subscription and, after the shared LNA, the UE may split the signaling associated with the first network subscription from the signaling associated with the second network subscription and may process the signaling associated with each network subscription via separate receive paths within a transceiver of the UE. Each receive path may include another LNA (e.g., an internal LNA) and, in some implementations, the UE may determine a first receive GS (e.g., a first transceiver GS) for a first receive path associated with the first network subscription based on the first GS associated with the first network subscription. Additionally, the UE may determine a second receive GS for a second receive path associated with the second network subscription based on the gain for the shared LNA and a second GS associated with the second subscription. As such, the UE may set the second receive GS for the second receive path associated with the second network subscription in accordance with (e.g., with knowledge of) the gain of the shared LNA (which may be controlled by the first network subscription) to achieve an overall gain for the signaling associated with the second subscription.

A method for wireless communication at a UE is described. The method may include receiving, via an antenna of the UE, a first signal associated with a first network subscription on a first receive path of the antenna and a second signal associated with a second network subscription on a second receive path of the antenna, determining a first GS associated with the first network subscription based on a signal strength of the first signal, setting a first gain for a LNA that is coupled with the antenna based on the first GS, where the LNA is shared between first signaling associated with the first network subscription and second signaling associated with the second network subscription, determining a second GS associated with the second network subscription based on a signal strength of the second signal and the first gain for the LNA, setting a first receive GS for the first receive path of the antenna associated with the first network subscription based on the first GS, and setting a second receive GS for the second receive path of the antenna associated with the second network subscription based on the second GS.

An apparatus for wireless communication at a UE is described. The apparatus may include a processor, memory coupled with the processor, and instructions stored in the memory. The instructions may be executable by the processor to cause the apparatus to receive, via an antenna of the UE, a first signal associated with a first network subscription on a first receive path of the antenna and a second signal associated with a second network subscription on a second receive path of the antenna, determine a first GS associated with the first network subscription based on a signal strength of the first signal, set a first gain for a LNA that is coupled with the antenna based on the first GS, where the LNA is shared between first signaling associated with the first network subscription and second signaling associated with the second network subscription, determine a second GS associated with the second network subscription based on a signal strength of the second signal and the first gain for the LNA, set a first receive GS for the first receive path of the antenna associated with the first network subscription based on the first GS, and set a second receive GS for the second receive path of the antenna associated with the second network subscription based on the second GS.

Another apparatus for wireless communication at a UE is described. The apparatus may include means for receiving, via an antenna of the UE, a first signal associated with a first network subscription on a first receive path of the antenna and a second signal associated with a second network subscription on a second receive path of the antenna, means for determining a first GS associated with the first network subscription based on a signal strength of the first signal, means for setting a first gain for a LNA that is coupled with the antenna based on the first GS, where the LNA is shared between first signaling associated with the first network subscription and second signaling associated with the second network subscription, means for determining a second GS associated with the second network subscription based on a signal strength of the second signal and the first gain for the LNA, means for setting a first receive GS for the first receive path of the antenna associated with the first network subscription based on the first GS, and means for setting a second receive GS for the second receive path of the antenna associated with the second network subscription based on the second GS.

A non-transitory computer-readable medium storing code for wireless communication at a UE is described. The code may include instructions executable by a processor to receive, via an antenna of the UE, a first signal associated with a first network subscription on a first receive path of the antenna and a second signal associated with a second network subscription on a second receive path of the antenna, determine a first GS associated with the first network subscription based on a signal strength of the first signal, set a first gain for a LNA that is coupled with the antenna based on the first GS, where the LNA is shared between first signaling associated with the first network subscription and second signaling associated with the second network subscription, determine a second GS associated with the second network subscription based on a signal strength of the second signal and the first gain for the LNA, set a first receive GS for the first receive path of the antenna associated with the first network subscription based on the first GS, and set a second receive GS for the second receive path of the antenna associated with the second network subscription based on the second GS.

In some examples of the method, apparatuses, and non-transitory computer-readable medium described herein, receiving the first signal associated with the first network subscription on the first receive path of the antenna and the second signal associated with the second network subscription on the second receive path of the antenna may include operations, features, means, or instructions for receiving the first signal and the second signal over an at least partially overlapping set of time and frequency resources.

In some examples of the method, apparatuses, and non-transitory computer-readable medium described herein, setting the first gain for the LNA may include operations, features, means, or instructions for inputting, into a transceiver unit of the UE, the first GS associated with the first signal and determining, as an output of the transceiver unit, the first gain for the LNA based on inputting the first GS associated with the first signal.

In some examples of the method, apparatuses, and non-transitory computer-readable medium described herein, receiving the first signal associated with the first network subscription on the first receive path of the antenna and the second signal associated with the second network subscription on the second receive path of the antenna may include operations, features, means, or instructions for receiving, via a set of antennas including the antenna, the first signal and the second signal.

Some examples of the method, apparatuses, and non-transitory computer-readable medium described herein may further include operations, features, means, or instructions for detecting that an error rate associated with the second signal fails to satisfy a threshold error rate for a threshold time duration, dropping the receiving of the first signal from receiving the first signal via the set of antennas to receiving the first signal via a first subset of one or more antennas, and dropping the receiving of the second signal from receiving the second signal via the set of antennas to receiving the second signal via a second subset of one or more antennas different from the first subset of one or more antennas, where the set of antennas includes the first subset of one or more antennas and the second subset of one or more antennas.

Some examples of the method, apparatuses, and non-transitory computer-readable medium described herein may further include operations, features, means, or instructions for setting a gain for each of one or more LNAs coupled with the first subset of one or more antennas based on the first signaling associated with the first network subscription and setting a gain for each of one or more LNAs coupled with the second subset of one or more antennas based on the second signaling associated with the second network subscription.

Some examples of the method, apparatuses, and non-transitory computer-readable medium described herein may further include operations, features, means, or instructions for blanking one or more receive paths of the first subset of one or more antennas associated with the second network subscription and blanking one or more receive paths of the second subset of one or more antennas associated with the first network subscription.

Some examples of the method, apparatuses, and non-transitory computer-readable medium described herein may further include operations, features, means, or instructions for tuning one or more receive paths of the first subset of one or more antennas associated with the second network subscription away from the second signaling associated with the second network subscription and tuning one or more receive paths of the second subset of one or more antennas associated with the first network subscription away from the first signaling associated with the first network subscription.

Some examples of the method, apparatuses, and non-transitory computer-readable medium described herein may further include operations, features, means, or instructions for detecting that the error rate associated with the second signal satisfies the threshold error rate, returning the receiving of the first signal from receiving the first signal via the first subset of one or more antennas to receiving the first signal via the set of antennas, and returning the receiving of the second signal from receiving the second signal via the second subset of one or more antennas to receiving the second signal via the set of antennas.

Some examples of the method, apparatuses, and non-transitory computer-readable medium described herein may further include operations, features, means, or instructions for detecting that the first network subscription enters a short discontinuous reception (DRx) mode and maintaining the first gain for the LNA for a duration of the short DRx mode.

Some examples of the method, apparatuses, and non-transitory computer-readable medium described herein may further include operations, features, means, or instructions for detecting that the first network subscription enters a long DRx mode and setting a gain for the LNA based on the second signaling associated with the second network subscription for a duration of the long DRx mode.

Some examples of the method, apparatuses, and non-transitory computer-readable medium described herein may further include operations, features, means, or instructions for splitting the first signal from the second signal based on receiving the first signal and the second signal via the antenna, where setting the first receive GS for the first receive path of the antenna and the second receive GS for the second receive path of the antenna may be based on splitting the first signal from the second signal.

In some examples of the method, apparatuses, and non-transitory computer-readable medium described herein, splitting the first signal from the second signal may include operations, features, means, or instructions for splitting the first signal from the second signal external to a processing path of a wireless transceiver and splitting the first signal from the second signal internal to the processing path of the wireless transceiver.

Some examples of the method, apparatuses, and non-transitory computer-readable medium described herein may further include operations, features, means, or instructions for setting the first network subscription as a priority network subscription based on a service type associated with the first network subscription, where setting the first gain for the LNA based on the first GS may be based on setting the first network subscription as the priority network subscription.

Some examples of the method, apparatuses, and non-transitory computer-readable medium described herein may further include operations, features, means, or instructions for demodulating the first signal via the first receive path associated with the first network subscription based on the first receive GS and demodulating the second signal via the second receive path associated with the second network subscription based on the second receive GS.

In some examples of the method, apparatuses, and non-transitory computer-readable medium described herein, the first GS associated with the first network subscription conveys information relating to a first AGC resolution for the first receive path and the second GS associated with the second network subscription conveys information relating to a second AGC resolution for the second receive path.

In some examples of the method, apparatuses, and non-transitory computer-readable medium described herein, the UE includes a mobile DSDA UE.

DETAILED DESCRIPTION

Figure 1:
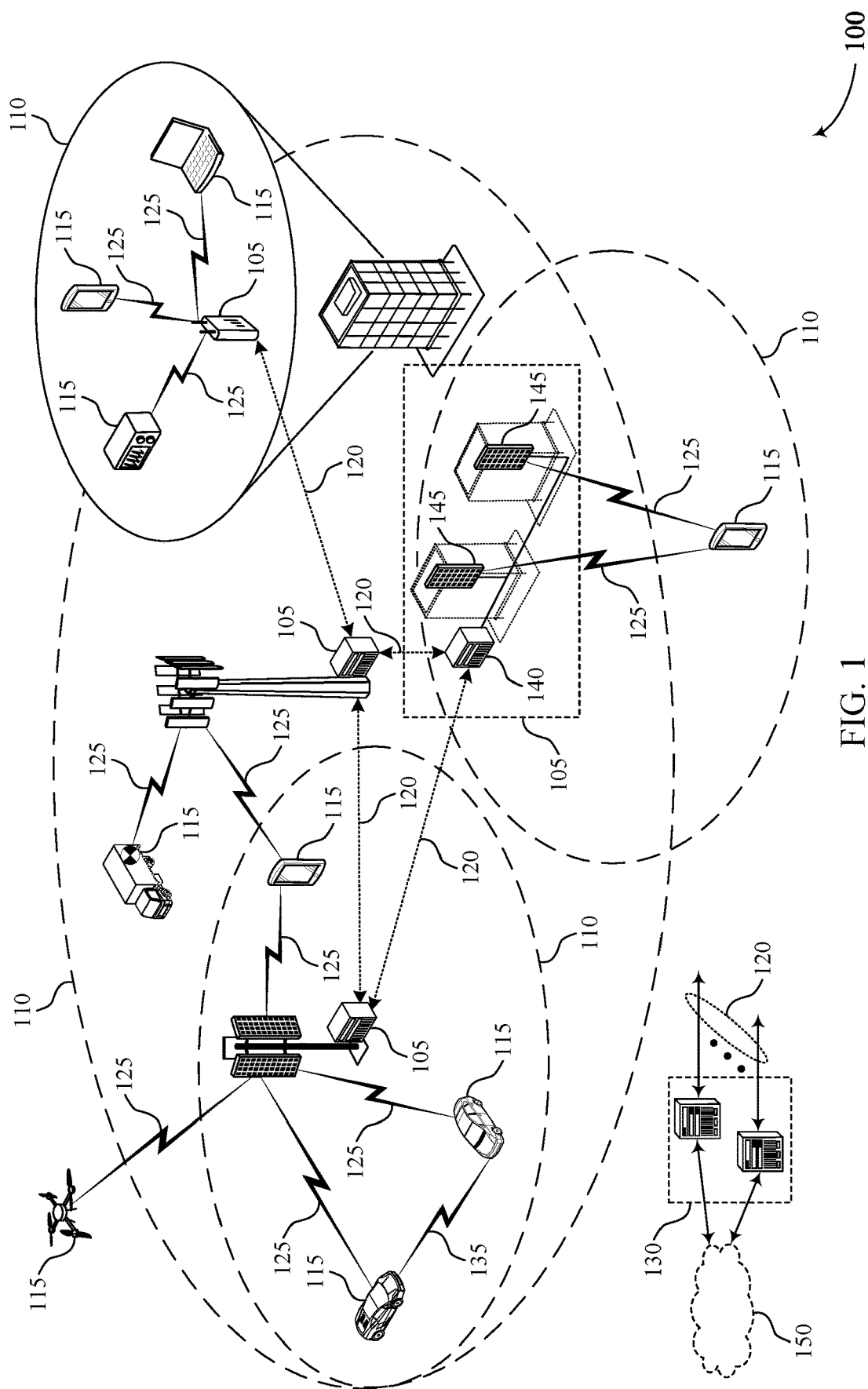
FIGS. 1 and 2 illustrate examples of wireless communications systems that support techniques for managing a shared low noise amplifier (LNA) automatic gain control (AGC) in dual subscriber identity module (SIM) dual active (DSDA) deployments in accordance with various aspects of the present disclosure.

In some wireless communications systems, a user equipment (UE) may be capable of operating or otherwise supporting multiple network subscriptions such that the UE may communicate with multiple networks or service providers. For example, the UE may be an example of a device that is capable of supporting multiple subscriber identity module (SIM) cards (e.g., the UE may be an example of a multi-SIM device) and the UE may use each SIM card to establish and support communication with a different service provider. In some examples, for instance, the UE may feature a first network subscription to a first service provider via a first SIM card and may feature a second network subscription to a second service provider via a second SIM card. As such, the UE may communicate with the first service provider using the first network subscription and may communicate with the second service provider using the second network subscription. In some deployments, such as in dual SIM dual active (DSDA) deployments, the UE may communicate with the first service provider via the first network subscription and the second service provider via the second network subscription when both the first network subscription and the second network subscription are in connected modes.

In some DSDA deployments, however, the UE may limit each network subscription to a subset of a quantity of antennas of the UE. For instance, in examples in which the UE features four antennas, the UE may use two antennas for receiving signaling associated with the first network subscription and may use a different two antennas for receiving signaling associated with the second network subscription. In other words, the UE may use an antenna to receive signaling associated with either the first network subscription or the second network subscription. As such, to increase a reception diversity or an achievable throughput of the signaling associated with the first network subscription or the second network subscription, the UE may increase the quantity of antennas configured at the UE. Such an increasing of the quantity of antennas on the UE, however, may result in increased power consumption, a larger area of the UE being occupied by antennas, and increased manufacturing costs.

In some implementations of the present disclosure, the UE may receive the signaling associated with the first network subscription and the signaling associated with the second network subscription via a same antenna of the UE and may employ an automatic gain control (AGC) feedback loop for setting a gain for a shared low noise amplifier (LNA) that is coupled with that same antenna of the UE. For example, the UE may receive, via the antenna, a first signal associated with the first network subscription and a second signal associated with the second network subscription and may pass both the first signal and the second signal through the shared LNA prior to splitting the first signal and the second signal down a first receive path of the antenna and a second receive path of the antenna, respectively. In some examples, and as part of the LNA AGC loop, the UE may control the gain of the shared LNA based on the signaling associated with the first network subscription (e.g., if the first network subscription is a priority network subscription) and may set respective gains for the first receive path and the second receive path based on the signaling associated with the first network subscription and the second network subscription, respectively.

Further, in some implementations, the UE may similarly receive the first signal associated with the first network subscription and the second signal associated with the second network subscription via a set of antennas and may perform similar procedures for setting a gain for a shared LNA of each of the set of antennas and for setting respective gains for each receive path of each of the set of antennas. In such implementations, the UE may manage the receiving of the first signal and the second signal in accordance with various events or conditions associated with the UE. For example, the UE may switch from using the set of antennas for receiving both the first signal and the second signal to using a first subset of antennas for receiving the first signal and a second subset for receiving the second signal if the UE detects that an error rate or a signal strength associated with one of the first signal or the second signal fails to satisfy a threshold. In such examples, the UE may continue to monitor the error rate or the signal strength and, if the error rate or signal strength satisfies the threshold (e.g., recovers), the UE may resume the receiving of the first signal and the second signal via the complete set of antennas of the UE.

Various aspects of the subject matter described in this disclosure may be implemented to realize one or more of the following potential advantages. For example, based on implementing the techniques of the present disclosure, the UE may use a greater number of antennas for receiving signaling associated with each network subscription without increasing a quantity of operated antennas at the UE, which may result in greater reception diversity, greater achievable throughput, and greater downlink coverage (as compared to DSDA deployments in which the UE uses separate antennas for receiving signaling associated with different network subscriptions) without increasing manufacturing costs or occupying a greater amount of area of the UE with antennas. Further, the UE may achieve lower complexity as compared to other shared LNA AGC management techniques, as the UE may potentially avoid using an internal LNA split with a common AGC across different network subscriptions, which may result in problems or complications due to a limited allowable receive strength imbalance between the different network subscriptions.

Aspects of the disclosure are initially described in the context of wireless communications systems. Additionally, aspects of the disclosure are illustrated by and described with reference to example antenna configurations, signal processing diagrams, processing timelines, and process flows. Aspects of the disclosure are further illustrated by and described with reference to apparatus diagrams, system diagrams, and flowcharts that relate to techniques for managing a shared LNA AGC in DSDA deployments.

FIG. 1 illustrates an example of a wireless communications system 100 that supports techniques for managing a shared LNA AGC in DSDA deployments in accordance with various aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission-based) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a geographic coverage area 110 over which the UEs 115 and the base station 105 may establish one or more communication links 125. The geographic coverage area 110 may be an example of a geographic area over which a base station 105 and a UE 115 may support the communication of signals according to one or more radio access technologies.

The UEs 115 may be dispersed throughout a geographic coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may include one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORE-SET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell may cover a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission-based communications. The UEs 115 may be designed to support ultra-reliable, or low-latency (e.g., mission-based functions). Ultra-reliable communications may include private communication or group communication and may be supported by one or more mission-based services such as mission-based push-to-talk (MCPTT), mission-based video (MCVideo), or mission-based data (MCData). Support for mission-based functions may include prioritization of services, and mission-based services may be used for public safety or general commercial applications. The terms ultra-reliable, low-latency, mission-based, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some examples, various functions of each access network entity 140 or base station 105 may be distributed across various network devices (e.g., radio heads and ANCs) or consolidated into a single network device (e.g., a base station 105).

The wireless communications system 100 may operate using one or more frequency bands, sometimes in the range of 300 megahertz (MHz) to 300 gigahertz (GHz). In some aspects, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at some orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with an orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some cases, a UE 115 may be capable of operating or otherwise supporting multiple network subscriptions such that the UE 115 may communicate with multiple network or service providers. For example, the UE 115 may be an example of a device that is capable of supporting multiple SIM cards (e.g., the UE 115 may be an example of a multi-SIM device) and the UE 115 may use each SIM card to establish and support communication with a different service provider. In some examples, for instance, the UE 115 may feature a first network subscription to a first service provider (e.g., a first base station 105) via a first SIM card and may feature a second network subscription to a second service provider (e.g., a second base station 105) via a second SIM card. As such, the UE 115 may communicate with the first service provider using the first network subscription and may communicate with the second service provider using the second network subscription. In some deployments, such as in DSDA deployments, the UE 115 may simultaneously communicate with the first service provider via the first network subscription and the second service provider via the second network subscription.

In such deployments, the UE 115 may receive a first signal associated with the first network subscription and a second signal associated with the second network subscription via a same antenna of the UE 115. In some examples, the UE 115 may receive the first signal on a first receive path associated with the first network subscription and may receive the second signal on a second receive path associated with the second network subscription. Accordingly, in some implementations of the present disclosure, the UE 115 may determine a first gain state (GS) associated with the first network subscription based on a signal strength of the first signal and may set a gain for a shared LNA (e.g., an LNA that is coupled with the antenna receiving both the first signal and the second signal and that is external to the separate receive paths for the first signal and the second signal) based on the first GS associated with the first subscription.

The UE 115, based on setting the gain for the shared LNA, may feedback the gain for the shared LNA and determine a second GS associated with the second subscription based on a signal strength of the second signal and based on the gain for the shared LNA. As such, the second GS associated with the second subscription may compensate or otherwise account for the gain of the shared LNA (through which signaling associated with the second subscription may pass, but over which the second subscription may not have control). Accordingly, the UE 115 may set a first receive GS for the first receive path (e.g., a first transceiver GS or a GS for a first LNA internal to the first receive path associated with the first network subscription) based on the first GS and may set a second receive GS for the second receive path (e.g., a second transceiver GS or a GS for a second LNA internal to the second receive path associated with the second network subscription) based on the second GS.

Figure 2:
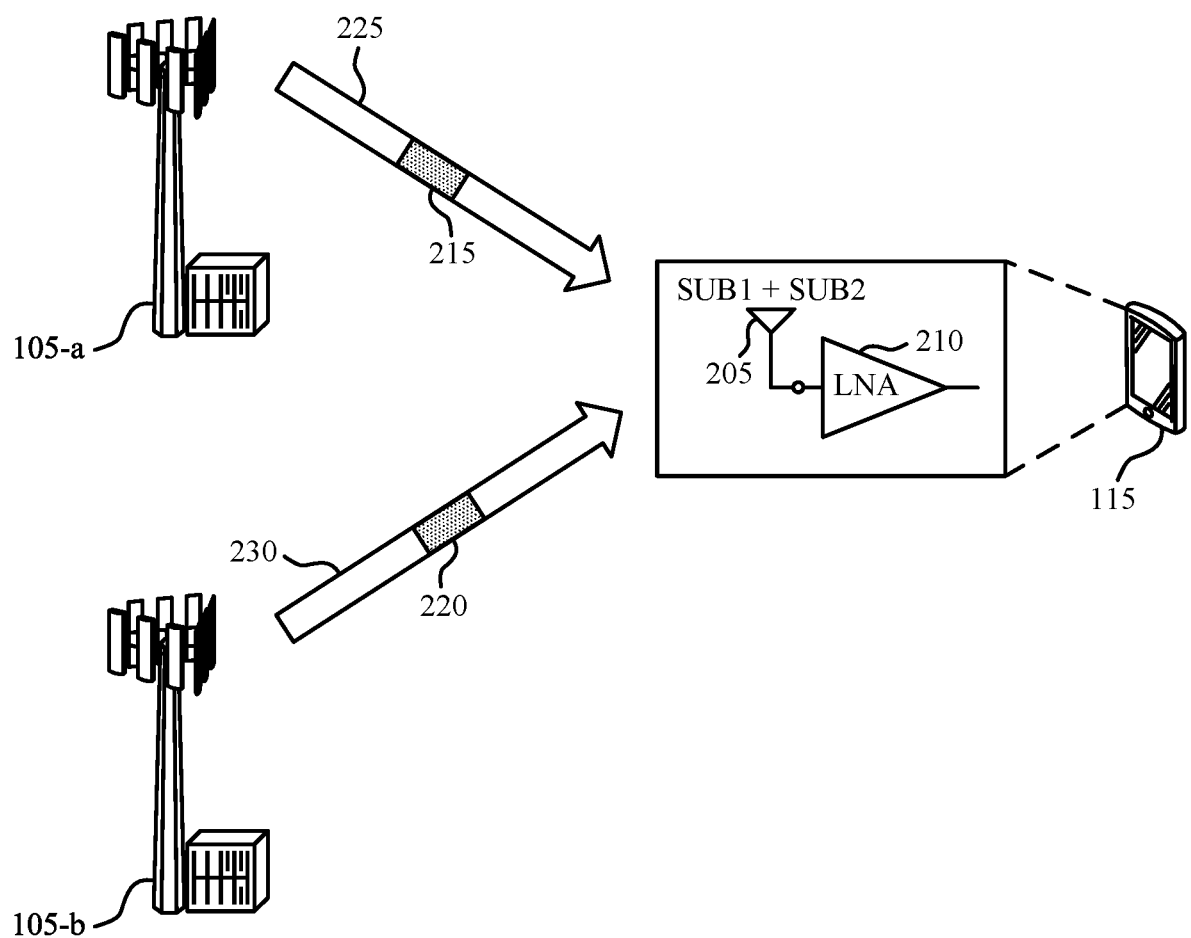

FIG. 2 illustrates an example of a wireless communications system 200 that supports techniques for managing a shared LNA AGC in DSDA deployments in accordance with various aspects of the present disclosure. The wireless communications system 200 may implement aspects of the wireless communications system 100. For example, the wireless communications system 200 illustrates communication between a base station 105-a, a base station 105-b, and a UE 115, which may be examples of corresponding devices described herein, including with reference to FIG. 1.

In some examples, the UE 115 may receive, via an antenna 205, a first signal 215 associated with a first network subscription (which may be referred to herein as a SUB1) from the base station 105-*a* over a communication link 225 and a second signal 220 associated with a second network subscription (which may be referred to herein as a SUB2) from the base station 105-*b* over a communication link 230 and may set a gain for an LNA 210 based on the received signaling and in connection with which of the SUB1 or the SUB2 is a priority SUB.

For example, the UE 115 may operate in a multi-SIM DSDA deployment or mode in which the UE 115 is capable of receiving signaling associated with different SUBs that are each in a connected mode (e.g., such that both SUB1 and SUB2 are in a connected mode). In cases in which the UE 115 is operating in a DSDA deployment, the UE 115 may receive signaling associated with different SUBs via different antennas of the UE 115. For instance, in examples in which the UE 115 operates a total of four antennas and supports the two network subscriptions SUB1 and SUB2, the UE 115 may receive signaling associated with the SUB1 via two of the four antennas and may receive signaling associated with the SUB2 via the other two of the four antennas. Similarly, in examples in which the UE 115 operates a total of two antennas and supports the two network subscriptions SUB1 and SUB2, the UE 115 may receive signaling associated with the SUB1 via a first antenna of the two antennas and may receive signaling associated with the SUB2 via a second antenna of the two antennas.

In some cases, a quantity of a total set of antennas that the UE 115 operates may be based on or related to a radio frequency spectrum band over which the UE 115 communicates. For example, the UE 115 may operate or enable a total of four antennas if the UE 115 communicates over a mid-band (MB), a high-band (HB), or an ultra-HB (UHB). In some aspects, such an operating of four antennas may be understood as a 4-Rx band if the UE 115 supports single-SIM operation. For further example, the UE 115 may operate or enable a total of two antennas if the UE 115 communicates over a low-band (LB). In some aspects, such an operating of two antennas may be understood as a 2-Rx band if the UE 115 supports single-SIM operation. In some examples, such an LB, an MB, an HB, and a UHB may each be associated with (e.g., include) one or more radio frequency spectrum band indexes.

In an example, the LB may be associated with an N5 radio frequency spectrum band, an N8 radio frequency spectrum band, or an N28 radio frequency spectrum band. The MB may be associated with an N1 radio frequency spectrum band or an N3 radio frequency spectrum band and, in some cases, may also be associated with an N34 radio frequency spectrum band, an N39 radio frequency spectrum band, or an N40 radio frequency spectrum band (which may be examples of radio frequency spectrum bands used by an LTE operator). The HB may be associated with an N41 radio frequency spectrum band and the UHB may be associated with an N78 radio frequency spectrum band or an N79 radio frequency spectrum band. In some examples, such radio frequency spectrum bands (or such designation of which radio frequency spectrum bands are associated with which of the LB, the MB, the HB, or the UHB) may be unique or specific to a geographic area (e.g., a country, such as China). These radio frequency spectrum bands are described for example purposes, however, and, as such, the techniques of the present disclosure may be equally applicable to any radio frequency spectrum bands in any geographic region.

In some examples, the UE 115 may operate in a co-banded multi-SIM DSDA deployment in which the multiple connected-mode SUBs with which the UE 115 supports communication may share an at least partially overlapping set of resources (e.g., time resources or frequency resources). As such, relevant metrics for such multi-SIM DSDA operation may include a slot format and a channel bandwidth (CBW). For example, if the UE 115 operates in such a co-banded multi-SIM DSDA deployment, the UE 115 may use a first SIM, such as a SIM1, to support communication with the SUB1 and may use a second SIM, such as a SIM2, to support communication with the SUB2 and the SIM1 and the SIM2 may be associated with an intra-band combination of frequency resources. In other words, the UE 115 may be in a co-banded DSDA deployment if the UE 115 communicates with both of the SUB1 and the SUB2 via frequency resources that are in-band of each other. In an example, the UE 115 may be in a co-banded DSDA deployment if both the SIM1 and the SIM2 are associated with communication over the N78 radio frequency spectrum band (and are both in a connected-mode).

Further, such a co-banded or intra-band combination may include any combination of radio frequency spectrum bands that have at least partially overlapping spectrum. For instance, an N77 radio frequency spectrum band may be an example of a super-set of frequency resources that includes the N78 radio frequency spectrum band and, as such, the N77 radio frequency spectrum band and the N78 radio frequency spectrum band may be treated or understood as co-banded. Additionally, such a concept of co-banded operation may be extended to the radio access technology level. For example, to support co-banded operation, the SIM1 may be associated with NR (such as NR sub-6 GHz) and the SIM2 may be associated with NR (such as NR sub-6 GHz), the SIM1 may be associated with LTE and the SIM2 may be associated with LTE, or the SIM1 may be associated with NR (such as NR sub-6 GHz) and the SIM2 may be associated with LTE.

In some cases, the UE 115 may limit or cap the reception of signaling associated with each SUB supported by the UE 115 to a maximum or upper limit quantity of antennas, such as two antennas, regardless of the radio frequency spectrum band over which the UE 115 communicates. For example, if the UE 115 operates four antennas (as may be relevant for the MB, the HB, and the UHB DSDA deployments), the UE 115 may limit or cap the receiving of signaling associated with the SUB1 to at most two antennas and may limit or cap the receiving of signaling associated with the SUB2 to at most two antennas. As such, the UE 115 may effectively set limits on an achievable throughput and coverage of the UE 115, which may result in relatively poor data rates or connectivity. In some aspects, the UE 115 may implement such a limit or cap on the quantity of antennas dedicated for each SUB to reduce complexity and to reuse existing resources. For instance, in examples in which the UE 115 limits the quantity of antennas dedicated for each SUB, the UE 115 may receive the signaling associated with the SUB1 over a different set of resources (e.g., a different set of frequency resources) than the signaling associated with the SUB2.

Further, in examples in which the base station 105-*a* (which may be associated with a service provider or network corresponding to the SUB1) transmits the signaling associated with the SUB1 over a first carrier and the base station 105-*b* (which may be associated with a service provider or network corresponding to the SUB2) transmits the signaling associated with the SUB2 over a second carrier, the signaling associated with the SUB1 carried over the first carrier and the signaling associated with the SUB2 carried over the second carrier may have asynchronous slots as a result of the base station 105-*a* and the base station 105-*b* being located at different geographic locations. As such, the two different carriers may potentially have an uncapped or limitless signal strength delta. In other words, for example, a first received signal strength indicator (RSSI) of the signaling associated with the SUB1 and a second RSSI of the signaling associated with the SUB2 may differ by an uncapped amount, which may potentially be approximately 20 dB or higher.

Additionally, in cases in which the SUB1 and the SUB2 are both associated with communication over the LB (e.g., N28+N28), the UE 115 may operate two antennas and, accordingly, may communicate with the base station 105-*a* (e.g., the service provider associated with the SUB1) using a first, single antenna and may communicate with the base station 105-*b* (e.g., the service provider associated with the SUB2) using a second, single antenna. Such use of a single, standalone antenna for each SUB may be associated with a relatively poor receive diversity and, accordingly, the likelihood for signal degradation (or complete loss of connection) may be relatively high. For example, if a finger, hand-grip, head, or other object blocks the single antenna that the UE 115 operates to communicate with the base station 105-*a*, the UE 115 may have a relatively high likelihood for dropping the service (e.g., a call) from the base station 105-*a*. For example, an antenna blockage from a hand or head may impact signal strength up to approximately 10 or 20 dB. Such antenna blockage may be common if an equipment manufacturer places one antenna at the bottom of the UE 115 and the other antenna at the top of the phone.

Further, although the UE 115 may limit or cap the reception of signaling associated with each SUB supported by the UE 115 to a quantity of two antennas in some cases, the UE 115 may, in some other cases, support co-banded SUB1 and SUB2 operation with four antennas for each of the SUB1 and the SUB2 without shared resources. For example, the UE 115 may operate or enable eight antennas at the UE 115 such that the UE 115 may receive signaling associated with the SUB1 via four antennas of the UE 115 and may receive signaling associated with the SUB2 via the other four antennas of the UE 115. Such operation of additional antennas at the UE 115 may increase throughput between the base stations 105 and the UE 115, but may come at a cost of increased power consumption at the UE 115, a larger area being occupied by antennas at the UE 115, and increased manufacturing costs at an equipment manufacturer.

In some implementations of the present disclosure, the UE 115 may support the reception of both the signaling associated with the SUB1 (e.g., the first signal 215) and the signaling associated with the SUB2 (e.g., the second signal 220) via a single antenna of the UE 115, such as the antenna 205, and may employ a split receiver architecture in the LNA 210 for separately processing the different signaling. In some examples, the LNA 210 may be a common LNA that is shared between the signaling associated with the SUB1 and the signaling associated with the SUB2 such that both the first signal 215 and the second signal 220 pass through the LNA 210 prior to being split. Accordingly, the UE 115 may split the first signal 215 and the second signal 220 after the LNA 210 and may process the first signal 215 and the second signal 220 using separate receive paths, which may be equivalently referred to as baseband filter (BBF) paths or transceiver paths, such that each SUB is associated with its own BBF. Additional details relating to such separate processing of the first signal 215 and the second signal 220 via separate BBF paths are described herein, including with reference to FIGS. 3 and 4.

In some examples, the UE 115 may determine a gain for the LNA 210 based on a priority SUB and may determine gains for each BBF path independently. For example, to determine the gain for the LNA 210, the UE 115 may identify or otherwise select one of the SUB1 or the SUB2 as the priority SUB and may determine the gain for the LNA 210 based on the signaling associated with the priority SUB. For instance, if the SUB1 is the priority SUB, the UE 115 may set the gain for the LNA based on the signaling associated with the SUB1 (e.g., the first signal 215). Such control of the gain for the LNA 210 and the gains for each BBF path (e.g., each receive path) are illustrated by and described in more detail with reference to FIGS. 5 through 7. Further, the UE 115 may extend such gain control for the LNA 210 and for each receive path of the antenna 205 to a number of antennas of the UE 115, such as four antennas. Such an extension to four antennas is illustrated by and described in more detail with reference to FIG. 8.

The UE 115 may accordingly receive the signaling associated with the SUB1 and the signaling associated with the SUB2 and may maintain, adjust, or update the set gains for the various LNAs and receive paths of the UE 115 in accordance with potentially varying receive strengths or channel conditions. In some examples, the UE 115 may monitor a signal quality, such as a signal strength (e.g., an RSSI), an error rate (e.g., a block error rate (BLER)), or a signal-to-noise ratio (SNR), for one or both of the first signal 215 or the second signal 220 and, if the UE 115 detects a signal degradation, the UE 115 may adjust the receiving of the signaling associated with both the SUB1 and the SUB2. For example, if the UE 115 detects that an RSSI or a BLER of the second signal 220 fails to satisfy a threshold value, the UE 115 may stop receiving both the first signal 215 and the second signal 220 via same antennas and instead drop the receiving of the first signal 215 to a first subset of one or more antennas and drop the receiving of the second signal 220 to a second subset of one or more antennas. Such a dropping of the receiving of the first signal 215 associated with the SUB1 and the dropping of the receiving of the second signal 220 to different subsets of antennas is illustrated and described in more detail with reference to FIG. 9.

Further, although some figures and description illustrate an LNA split architecture including a split that is external to a transceiver of the UE 115, such a splitting of the first signal 215 from the second signal 220 for separate processing via different receive paths may alternatively occur within the transceiver of the UE 115 without exceeding the scope of the present disclosure. Such an internal LNA split is illustrated by and described with reference to FIG. 10.

The UE 115, based on receiving the first signal 215 associated with the SUB1 over the communication link 225 and the second signal 220 associated with the SUB2 over the communication link 230 via the antenna 205, may achieve greater downlink coverage and greater throughput, as the UE 115 may effectively double the amount of antennas available for receiving signaling associated with each SUB supported by the UE 115. For example, if standardly employing a 2-Rx mode in which the UE 115 receives signaling associated with each SUB via two antennas (as may be the case for MB, HB, and UHB operation), the UE 115, based on implementing the techniques of the present disclosure, may achieve a coverage and a throughput commensurate with a 4-Rx mode in which the UE 115 receives signaling associated with each SUB via four antennas.

For instance, in an example of NR 100 MHz channel operation with a 30 kHz subcarrier spacing (SCS) with a 256 quadrature amplitude modulation (256QAM), which may correspond to a modulation and coding scheme (MCS) index of 27, the UE 115 may double an achievable throughput based on going from a 2-Rx mode to a 4-Rx mode without increasing power consumption, an occupied area, or manufacturing cost. In some examples, the UE 115 may also achieve a better sensitivity (which may be associated with a more reliable connection) in the 4-Rx mode than the 2-Rx mode.

Similarly, if standardly employing a 1-Rx mode in which the UE 115 receives signaling associated with each SUB via one antenna (as may be the case for LB operation), the UE 115, based on implementing the techniques of the present disclosure, may achieve a coverage and a throughput commensurate with a 2-Rx mode in which the UE 115 receives signaling associated with each SUB via two antennas. For example, the UE 115 may experience a lower likelihood for a drop-call event as a result of hand blockage if operating in the 2-Rx mode than if operating in the 1-Rx mode (especially if the UE 115 is at mid to cell edge). Further, based on employing the split architecture in the LNA 210, the UE 115 may reduce a number of front-end components, which may save area in the UE 115, reduce power consumption of the UE 115, and reduce manufacturing costs.

The UE 115 may also potentially avoid one or more drawbacks associated with other multi-SIM DSDA shared external LNA AGC management techniques across SUBs based on implementing the present disclosure in which a priority SUB controls the external LNA and non-priority SUBs adjust their receive paths in accordance with the priority SUB-controlled LNA GS. For example, the UE 115 may avoid using an internal LNA split with common AGC across SUBs, which may otherwise be problematic for multi-SIM due to a maximum or upper limit 6 dB imbalance allowed across SUBs per GS, which may be too strict of operation parameters for multi-SIM (e.g., a 6 dB imbalance may be more relevant for signaling from a same base station 105, which may not be the case for multi-SIM DSDA deployments). Further, the UE 115 may avoid using a transceiver "dummy" carrier, which may be problematic for multi-SIM operation as the UE 115 may reserve such a "dummy" carrier to keep the internal LNA in a single carrier aggregation split mode (which may affect single-SIM performance), which can be avoided if implementing a shared external LNA in DSDA deployments. Additionally, the AGC for the SUB1 and the SUB2 may avoid using a common forward loop AGC procedure based on implementing the techniques of the present disclosure, which may reduce processing complexity.

Further, in some examples, the UE 115 may obtain a greater number of measurements for more antennas of the UE 115 based on implementing the present disclosure, which may increase antenna switched diversity features that rely on measurements on the active antennas to select an antenna (e.g., a "best" antenna) for a transmission from the UE 115. For example, having four receive antennas instead of two receive antennas or two receive antennas instead of one receive antenna may enable the UE 115 to measure more antennas for antenna switched diversity evaluation procedures, according to which the UE 115 may select a transmit antenna (e.g., a transmit antenna providing a greatest spatial diversity or signal strength) for transmitting to the base station 105-*a* or the base station 105-*b*, or both.

Figure 3:
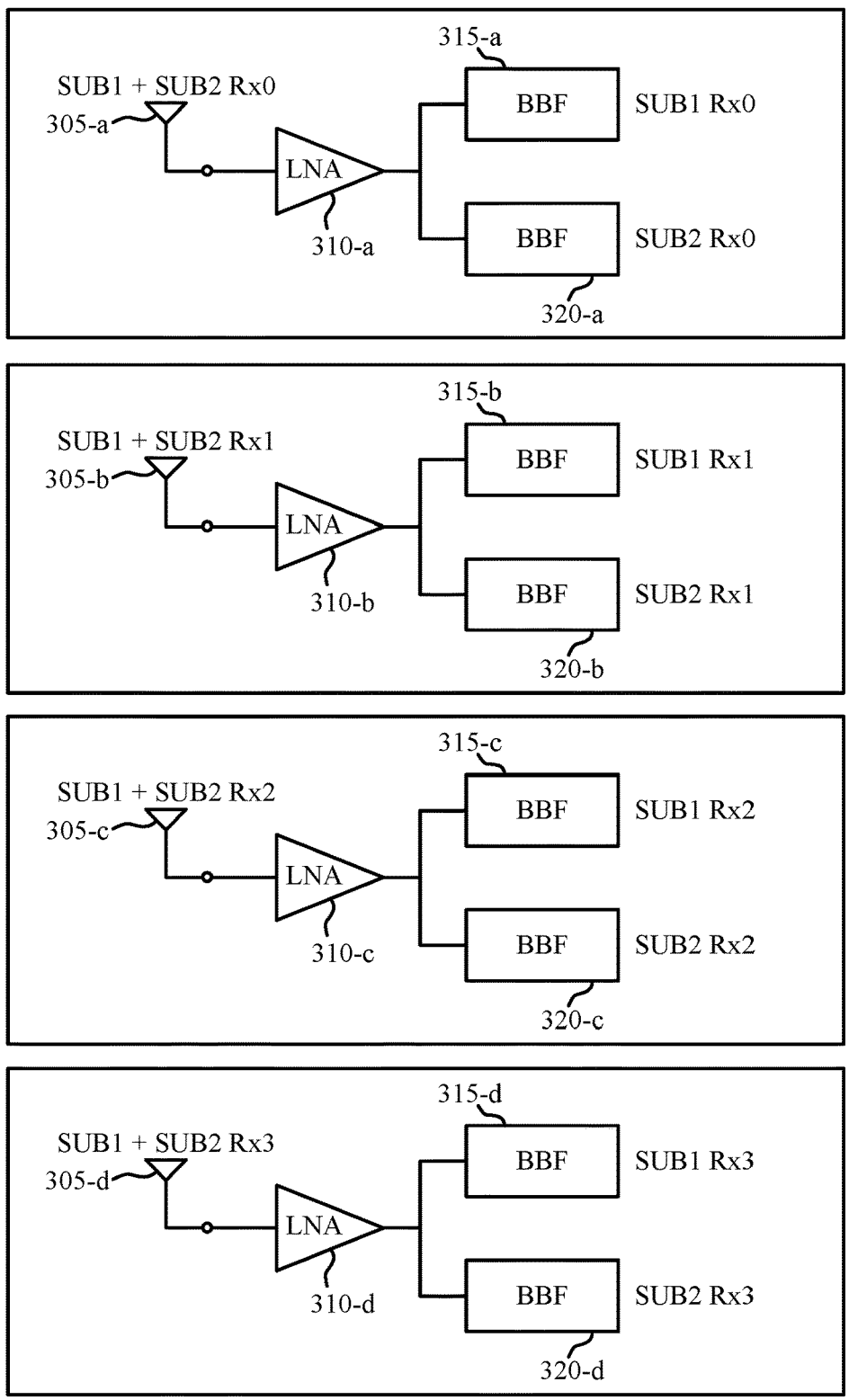
FIGS. 3 and 4 illustrate examples of antenna configurations that support techniques for managing a shared LNA AGC in DSDA deployments in accordance with various aspects of the present disclosure.

FIG. 3 illustrates an example of an antenna configuration 300 that supports techniques for managing a shared LNA AGC in DSDA deployments in accordance with various aspects of the present disclosure. The antenna configuration 300 may implement or be implemented to realize aspects of the wireless communications system 100 or the wireless communications system 200. For example, the antenna configuration 300 may illustrate a set of antennas 305 over which a UE 115, which may be an example of corresponding devices described herein, may receive both first signaling associated with a first network subscription (e.g., a SUB1) and second signaling associated with a second network subscription (e.g., a SUB2).

For example, and as shown in FIG. 3, the UE 115 may operate four antennas 305 including an antenna 305-*a*, an antenna 305-*b*, an antenna 305-*c*, and an antenna 305-*d*. In some implementations, the UE 115 may receive the first signaling associated with the SUB1 and the second signaling associated with the SUB2 via each antenna of the set of antennas 305, may pass both signaling through a shared LNA, and may split the signaling towards two different BBF paths, or receive paths, of that antenna. In some aspects, each BBF may be an example of or include an active filter having a gain and filter component and may be included within a transceiver of the UE 115. Further, as described herein, the split between the first signaling and the second signaling may be external to the transceiver or internal to the transceiver.

In an example, the UE 115 may receive the signaling from both the SUB1 and the SUB2 over the antenna 305-*a* (e.g., a SUB1+SUB2 Rx0), pass the signaling through an LNA 310-*a*, and split the first signaling associated with the SUB1 towards a BBF path 315-*a* and the second signaling associated with the SUB2 towards a BBF path 320-*a*. In some aspects, the BBF path 315-*a* associated with the SUB1 may be referred to herein as a SUB1 Rx0, as the UE 115 may receive the first signaling associated with the SUB1 on the BBF path 315-*a* of the antenna 305-*a*. Similarly, the BBF path 320-*a* associated with the SUB2 may be referred to herein as a SUB2 Rx0, as the UE 115 may receive the second signaling associated with the SUB2 on the BBF path 320-*a* of the antenna 305-*a*.

Additionally or alternatively, the UE 115 may receive the signaling from both the SUB1 and the SUB2 over the antenna 305-*b* (e.g., a SUB1+SUB2 Rx1), pass the signaling through an LNA 310-*b*, and split the first signaling associated with the SUB1 towards a BBF path 315-*b* and the second signaling associated with the SUB2 towards a BBF path 320-*b*. In some aspects, the BBF path 315-*b* associated with the SUB1 may be referred to herein as a SUB1 Rx1, as the UE 115 may receive the first signaling associated with the SUB1 on the BBF path 315-*b* of the antenna 305-*b*. Similarly, the BBF path 320-*b* associated with the SUB2 may be referred to herein as a SUB2 Rx1, as the UE 115 may receive the second signaling associated with the SUB2 on the BBF path 320-*b* of the antenna 305-*b*.

Additionally or alternatively, the UE 115 may receive the signaling from both the SUB1 and the SUB2 over the antenna 305-*c* (e.g., a SUB1+SUB2 Rx2), pass the signaling through an LNA 310-*c*, and split the first signaling associated with the SUB1 towards a BBF path 315-*c* and the second signaling associated with the SUB2 towards a BBF path 320-*c*. In some aspects, the BBF path 315-*c* associated with the SUB1 may be referred to herein as a SUB1 Rx2, as the UE 115 may receive the first signaling associated with the SUB1 on the BBF path 315-c of the antenna 305-c. Similarly, the BBF path 320-c associated with the SUB2 may be referred to herein as a SUB2 Rx2, as the UE 115 may receive the second signaling associated with the SUB2 on the BBF path 320-c of the antenna 305-c.

Additionally or alternatively, the UE 115 may receive the signaling from both the SUB1 and the SUB2 over the antenna 305-d (e.g., a SUB1+SUB2 Rx3), pass the signaling through an LNA 310-d, and split the first signaling associated with the SUB1 towards a BBF path 315-d and the second signaling associated with the SUB2 towards a BBF path 320-d. In some aspects, the BBF path 315-d associated with the SUB1 may be referred to herein as a SUB1 Rx3, as the UE 115 may receive the first signaling associated with the SUB1 on the BBF path 315-d of the antenna 305-d. Similarly, the BBF path 320-d associated with the SUB2 may be referred to herein as a SUB2 Rx3, as the UE 115 may receive the second signaling associated with the SUB2 on the BBF path 320-d of the antenna 305-d.

In some implementations, the UE 115 may set a gain for the LNAs 310 that are coupled with the set of antennas 305 based on a GS associated with a priority SUB. For example, if the UE 115 identifies or otherwise selects the SUB1 as the priority SUB, the UE 115 may use the GS associated with the SUB1 (as computed during the various BBF paths 315) to set the gain for the LNAs 310. Further, although shown as operating four antennas 305, the UE 115 may operate any number of antennas 305 without exceeding the scope of the present disclosure.

Additionally, in some examples, the UE 115 may incorporate a combination of shared antennas and LNAs (e.g., antennas and LNAs that are shared between the first signaling associated with the SUB1 and the second signaling associated with the SUB2) and dedicated or independent antennas and LNAs (e.g., antennas and LNAs that are exclusively used for receiving either the first signaling associated with the SUB1 or the second signaling associated with the SUB2, and not both). Such a combination of shared antennas and LNAs with dedicated or independent antennas and LNAs is illustrated by and described in more detail with reference to FIG. 4.

Figure 4:
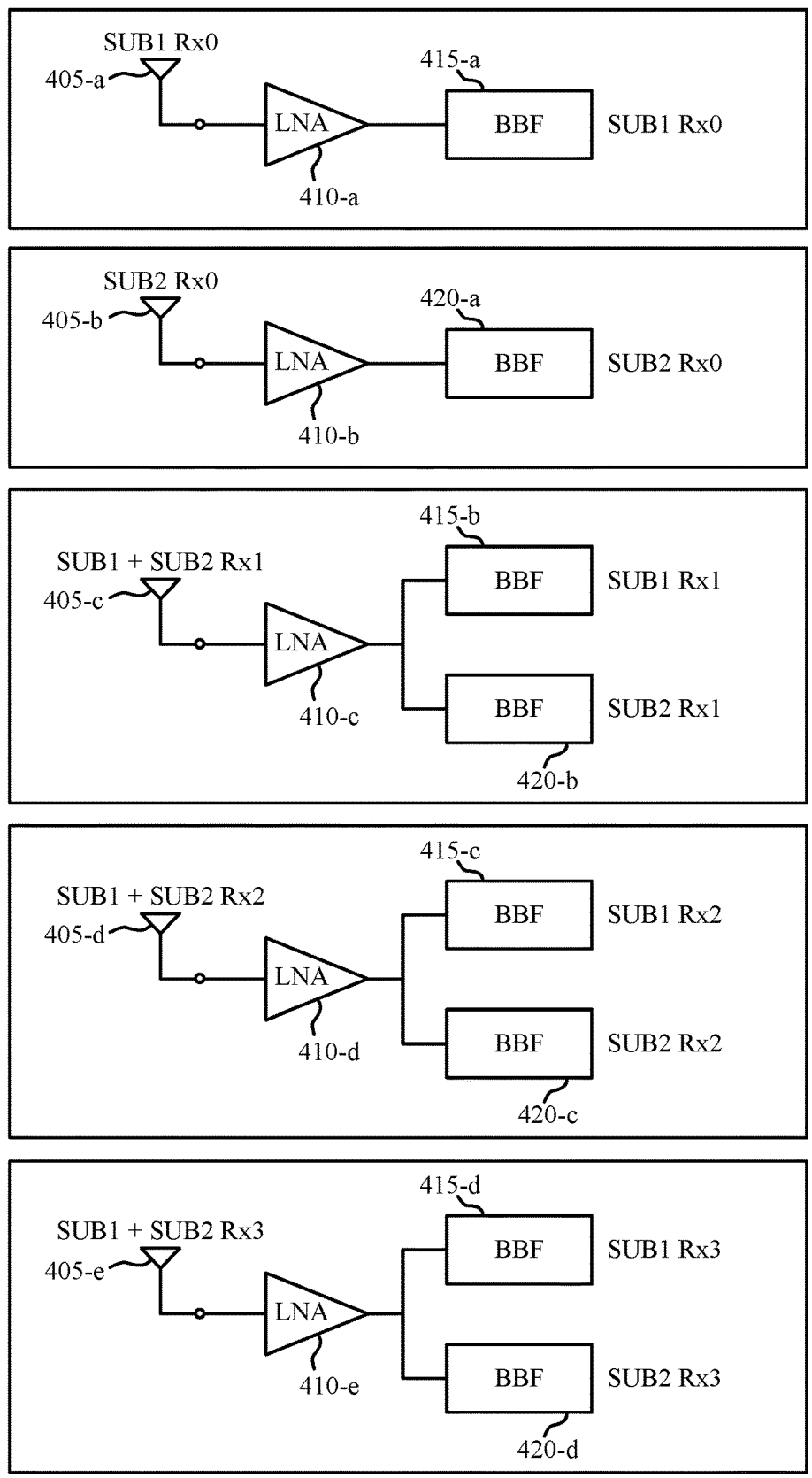

FIG. 4 illustrates an example of an antenna configuration 400 that supports techniques for managing a shared LNA AGC in DSDA deployments in accordance with various aspects of the present disclosure. The antenna configuration 400 may implement or be implemented to realize aspects of the wireless communications system 100 or the wireless communications system 200. For example, the antenna configuration 400 may illustrate a set of antennas 405 over which a UE 115, which may be an example of corresponding devices described herein, may receive one or both of first signaling associated with a first network subscription (e.g., a SUB1) or second signaling associated with a second network subscription (e.g., a SUB2).

For example, and as shown in FIG. 4, the UE 115 may operate a total of five antennas 405 including an antenna 405-a, an antenna 405-b, an antenna 405-c, an antenna 405-d, and an antenna 405-e. In some implementations, the UE 115 may receive the first signaling associated with the SUB1 and the second signaling associated with the SUB2 via a first subset of shared antennas of the set of antennas 405 and may receive either the first signaling associated with the SUB1 or the second signaling associated with the SUB2 via a second subset of dedicated or independent antennas of the set of antennas 405. In some aspects, each BBF may be an example of or include an active filter having a gain and filter component and may be included within a transceiver of the UE 115. Further, as described herein, the split between the first signaling and the second signaling may be external to the transceiver or internal to the transceiver.

For instance, based on a system architecture, the UE 115 may operate or enable more than four antennas (such as five or more antennas) for co-banded multi-SIM DSDA deployments. In such examples in which the UE 115 operates five or more antennas, the UE 115 may configure one or more antennas as dedicated or exclusive antennas that are dedicatedly or independently used for signaling associated with one SUB. In some aspects, a number of shared front-ends (e.g., shared antennas and LNAs receiving signaling associated with the SUB1 and the SUB2) may influence a number of dedicated or independent BBFs (e.g., filters) and antennas. In some examples, the number of additional BBFs that the UE 115 may use for each SUB may be calculated according to (4−m)*2, where m is equal to the number of shared front-ends or paths. For example, if the UE 115 uses m=3 shared front-ends or paths and keeps one dedicated front-end or path per SUB, each SUB may use an additional BBF.

In an example, the UE 115 may receive the first signaling associated with the SUB1 via the antenna 405-a (e.g., a SUB1 Rx0 and a dedicated or independent antenna), may pass the first signaling through an LNA 410-a, and may process the first signaling via a BBF path 415-a. In some aspects, the BBF path 415-a associated with the SUB1 may be referred to as a SUB1 Rx0, as the UE 115 may receive the first signaling associated with the SUB1 on the BBF path 415-a of the antenna 405-a. Additionally or alternatively, the UE 115 may receive the second signaling associated with the SUB2 via the antenna 405-b (e.g., a SUB2 Rx0 and a dedicated or independent antenna), may pass the second signaling through an LNA 410-b, and may process the second signaling via a BBF path 420-a. In some aspects, the BBF path 420-a associated with the SUB2 may be referred to as a SUB2 Rx0, as the UE 115 may receive the second signaling associated with the SUB2 on the BBF path 420-a of the antenna 405-b.

Additionally or alternatively, the UE 115 may receive the signaling from both the SUB1 and the SUB2 over the antenna 405-c (e.g., a SUB1+SUB2 Rx1), pass the signaling through an LNA 410-c, and split the first signaling associated with the SUB1 towards a BBF path 415-b and the second signaling associated with the SUB2 towards a BBF path 420-b. In some aspects, the BBF path 415-b associated with the SUB1 may be referred to herein as a SUB1 Rx1, as the UE 115 may receive the first signaling associated with the SUB1 on the BBF path 415-b of the antenna 405-c. Similarly, the BBF path 420-b associated with the SUB2 may be referred to herein as a SUB2 Rx1, as the UE 115 may receive the second signaling associated with the SUB2 on the BBF path 420-b of the antenna 405-c.

Additionally or alternatively, the UE 115 may receive the signaling from both the SUB1 and the SUB2 over the antenna 405-d (e.g., a SUB1+SUB2 Rx2), pass the signaling through an LNA 410-d, and split the first signaling associated with the SUB1 towards a BBF path 415-c and the second signaling associated with the SUB2 towards a BBF path 420-c. In some aspects, the BBF path 415-c associated with the SUB1 may be referred to herein as a SUB1 Rx2, as the UE 115 may receive the first signaling associated with the SUB1 on the BBF path 415-c of the antenna 405-d. Similarly, the BBF path 420-c associated with the SUB2 may be referred to herein as a SUB2 Rx2, as the UE 115 may receive the second signaling associated with the SUB2 on the BBF path 420-c of the antenna 405-d.

Additionally or alternatively, the UE 115 may receive the signaling from both the SUB1 and the SUB2 over the antenna 405-*e* (e.g., a SUB1+SUB2 Rx3), pass the signaling through an LNA 410-*e*, and split the first signaling associated with the SUB1 towards a BBF path 415-*d* and the second signaling associated with the SUB2 towards a BBF path 420-*d*. In some aspects, the BBF path 415-*d* associated with the SUB1 may be referred to herein as a SUB1 Rx3, as the UE 115 may receive the first signaling associated with the SUB1 on the BBF path 415-*d* of the antenna 405-*e*. Similarly, the BBF path 420-*d* associated with the SUB2 may be referred to herein as a SUB2 Rx3, as the UE 115 may receive the second signaling associated with the SUB2 on the BBF path 420-*d* of the antenna 405-*e*.

The UE 115 may set a gain for the LNA 410-*a* that is coupled with the antenna 405-*a* based on a GS associated with the SUB1 as a result of the antenna 405-*a* being the SUB1 Rx0. Similarly, the UE 115 may set a gain for the LNA 410-*b* that is coupled with the antenna 405-*b* based on a GS associated with the SUB2 as a result of the antenna 405-*b* being the SUB2 Rx0. In some implementations, the UE 115 may set a gain for the LNAs 410 that are coupled with the antenna 405-*c*, the antenna 405-*d*, and the antenna 405-*e* based on a GS associated with a priority SUB. For example, if the UE 115 identifies or otherwise selects the SUB1 as the priority SUB, the UE 115 may use the GS associated with the SUB1 (as computed during the various BBF paths 415) to set the gain for the LNAs 410.

Figure 5:
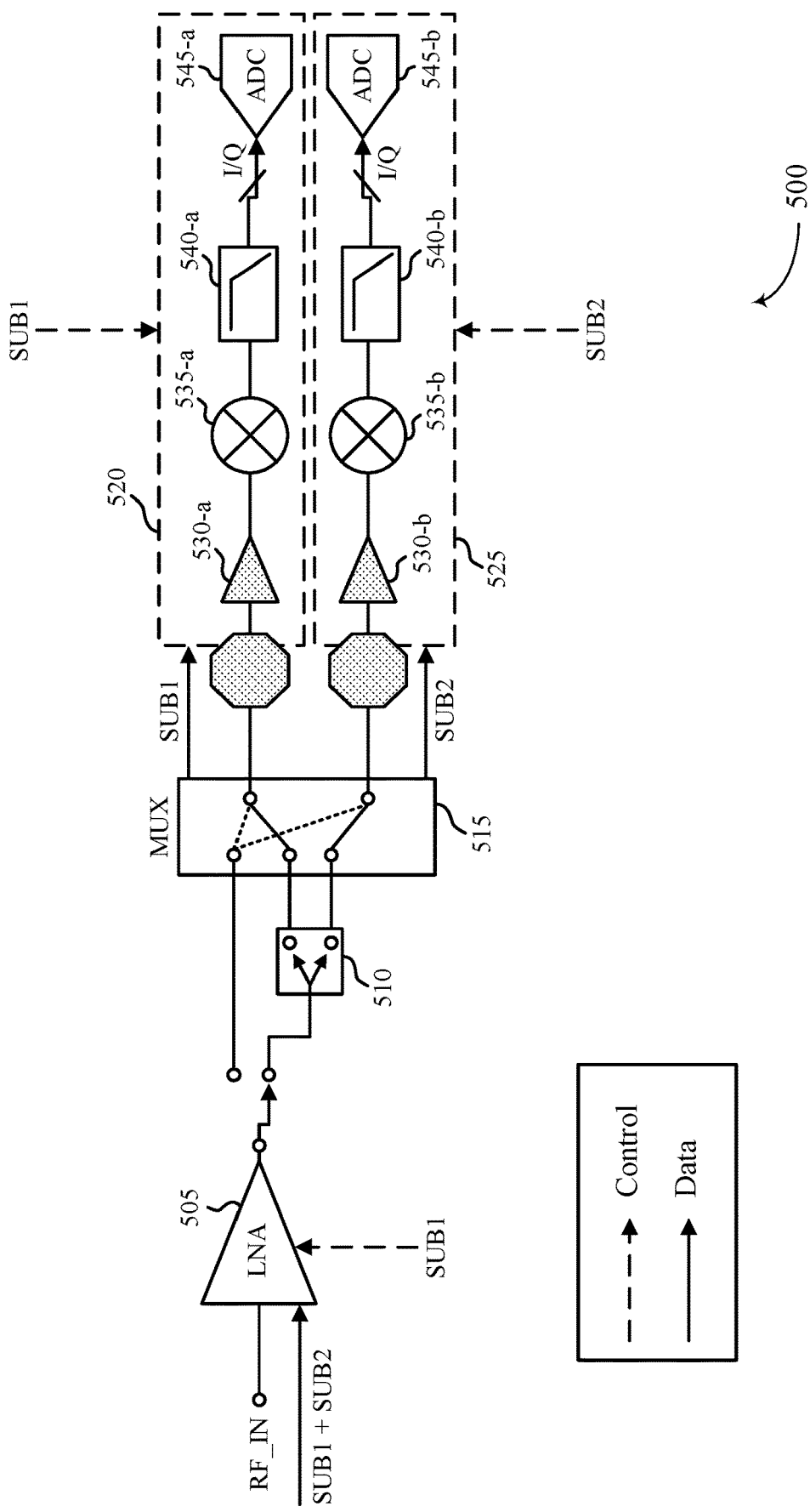
FIGS. 5 and 6 illustrate examples of signal processing diagrams that support techniques for managing a shared LNA AGC in DSDA deployments in accordance with various aspects of the present disclosure.

FIG. 5 illustrates an example of a signal processing diagram 500 that supports techniques for managing a shared LNA AGC in DSDA deployments in accordance with various aspects of the present disclosure. The signal processing diagram 500 may implement or be implemented to realize aspects of the wireless communications system 100 or the wireless communications system 200. For example, a UE 115, which may be an example of corresponding devices described herein, may perform the operations of the signal processing diagram 500 to manage LNA AGC for an LNA 505 that is shared between first signaling associated with a first network subscription (e.g., a SUB1) and second signaling associated with a second network subscription (e.g., a SUB2) and to manage gains for a receive path 520 associated with the SUB1 and a receive path 525 associated with the SUB2.

In some examples, the UE 115 may receive, via an antenna of the UE 115, the first signaling associated with the SUB1 and the second signaling associated with the SUB2. In some aspects, the first signaling associated with the SUB1 and the second signaling associated with the SUB2 received via the antenna of the UE 115 may referred to or understood as a radio frequency input RF_IN. The UE 115 may pass the first signaling associated with the SUB1 and the second signaling associated with the SUB2 received via the antenna through the LNA 505 (e.g., an external LNA) that is coupled with the antenna.

In some implementations of the present disclosure, the LNA 505 is shared between the first signaling associated with the SUB1 and the second signaling associated with the SUB2 and a priority SUB, such as the SUB1, may control a gain of the LNA 505. In some examples, the UE 115 (or a modem of the UE 115) may identify or select the SUB1 as the priority SUB based on a priority policy. In some aspects, the priority policy may be service type-based such that the UE 115 may select the SUB1 as the priority SUB if a service type of the first signaling associated with the SUB1 is associated with a higher priority than other service types associated with other SUBs supported by the UE 115. For example, the first signaling may include or convey a voice service and the UE 115 may, in accordance with the priority policy, designate the voice service as relatively higher priority than other service types.

For further example, if the signaling associated with the SUB1 and the SUB2 corresponds to service types having a same priority (such as data), the UE 115 may select the SUB1 as the priority SUB if the SUB1 is a default or designated data SUB. In some examples, the UE 115 may extend the priority policy to make or designate a DSDA SUB with a real-time traffic service type (e.g., media traffic packets carried on the DSDA SUB encapsulated via a real-time transport protocol (RTP), a user datagram protocol (UDP), or an IP real-time IP protocol headers). Additional details relating to such control of the LNA 505 by the priority SUB (e.g., the SUB1) are described herein, including with reference to FIG. 6.

In examples in which the antenna of the UE 115 receives both the first signaling associated with the SUB1 and the second signaling associated with the SUB2 via the antenna, the UE 115 may initiate a split mode and may split the first signaling from the second signaling via a splitter 510. The UE 115, using the splitter 510, may split or separate the first signaling associated with the SUB1 from the second signaling associated with the SUB2 and may pass the split signaling to a multiplexer 515 (which may also function as a demultiplexer). The splitter 510 may be external to a transceiver of the UE 115 (as shown in FIG. 5) or internal to a transceiver of the UE 115, as illustrated by and described with reference to FIG. 10. Alternatively, in examples in which the UE 115 receives one of the first signaling associated with the SUB1 or the second signaling associated with the SUB2 via the antenna (and not both), the UE 115 may bypass the splitter 510 via another path to the multiplexer 515.

The UE 115 may pass the first signaling associated with the SUB1 to the receive path 520 (which may be an example of a BBF path 315 or a BBF path 415, as shown in FIGS. 3 and 4, respectively) and may pass the second signaling associated with the SUB2 to the receive path 525 (which may be an example of a BBF path 320 or a BBF path 420, as shown in FIGS. 3 and 4, respectively). In some aspects, the receive path 520 associated with the SUB1 and the receive path 525 associated with the SUB2 may be internal to the transceiver of the UE 115 and, in some aspects, may be equivalently referred to as transceiver paths.

The receive path 520 associated with the SUB1 may include an internal LNA 530-*a*, a mixer 535-*a*, a low-pass filter 540-*a*, an in-phase and quadrature (I/Q) demodulation step, and an analog-to-digital converter (ADC) 545-*a*. In some implementations of the present disclosure, the SUB1 may independently control a GS associated with the receive path 520 (e.g., a GS of the internal LNA 530-*a*), as described in more detail with reference to FIG. 6. In some aspects, such a GS associated with the receive path 520 may be referred to herein as a first receive GS for the receive path 520. Similarly, the receive path 525 associated with the SUB2 may include an internal LNA 530-*b*, a mixer 535-*b*, a low-pass filter 540-*b*, an I/Q demodulation step, and an ADC 545-*b*. In some implementations of the present disclosure, the SUB2 may independently control a GS associated with the receive path 525 (e.g., a GS of the internal LNA 530-*b*), as described in more detail herein, including with reference to FIG. 6. In some aspects, such a GS associated with the receive path 525 may be referred to herein as a second receive GS for the receive path 525.

In some implementations, the UE 115 may perform one or more LNA AGC management decisions based on one or more states or power saving modes of the UE 115. For example, the UE 115 may make LNA AGC management decisions based on a discontinuous reception (DRx) mode, such as a connected mode DRx (CDRx) mode, of the SUB1 and the SUB2. In some examples, for instance, if the SUB2 enters a CDRx mode or a sleep mode (e.g., a usleep mode), the UE 115 may maintain the control of the SUB1 for setting the gain for the LNA 505.

On the other hand, if the SUB1 enters a CDRx mode or a sleep mode (e.g., a usleep mode), the UE 115 may either suspend control of the LNA 505 or may give control of the gain for the LNA 505 to the SUB2 depending on a length or duration of the CDRx mode or the sleep mode. For example, if the SUB1 enters a short CDRx mode, the UE 115 may suspend control of the LNA 505 and may maintain a current or previous LNA GS (e.g., an LNA GS set right before the SUB1 uses the CDRx mode) for a duration of the short CDRx mode without giving control of the LNA 505 to the SUB2. Alternatively, if the SUB1 enters a long CDRx mode, the UE 115 may transfer control of the LNA 505 to the SUB2 for a duration of the long CDRx mode and may transfer control of the LNA 505 back to the SUB1 when the SUB1 exits the long CDRx mode.

As such, the UE 115 may achieve cross-SUB awareness of either SUB going into a deep sleep procedure due to CDRx. In some examples, CDRx activity in DSDA deployments for either the SUB1 or the SUB2 may trigger action on the radio frequency driver software to not vote OFF shared components and also to maintain circuitry components in a gain mode to avoid introducing glitches and impairments to the SUB not going into the deep sleep mode. For example, regardless of how control of the LNA 505 is allocated during the CDRx mode or the sleep mode of either of the SUB1 or the SUB2, the UE 115 may leave both internal LNAs 530 on to maintain an impedance associated with the transceiver of the UE 115.

Figure 6:
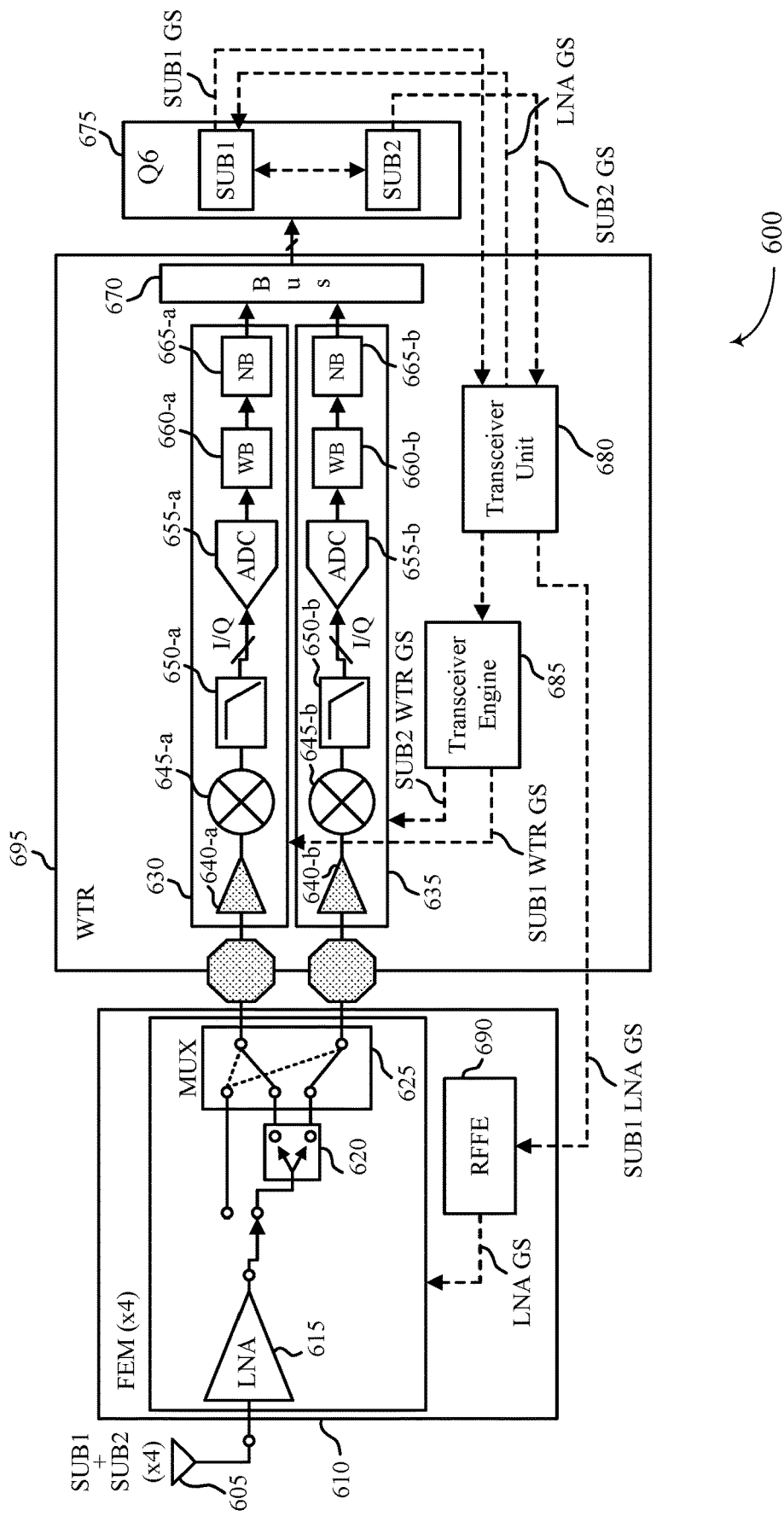

FIG. 6 illustrates an example of a signal processing diagram 600 that supports techniques for managing a shared LNA AGC in DSDA deployments in accordance with various aspects of the present disclosure. The signal processing diagram 600 may implement or be implemented to realize aspects of the wireless communications system 100 or the wireless communications system 200. For example, a UE 115, which may be an example of corresponding devices described herein, may perform the operations of the signal processing diagram 600 to manage LNA AGC for an LNA 615 that is shared between first signaling associated with a first network subscription (e.g., a SUB1) and second signaling associated with a second network subscription (e.g., a SUB2) and to manage gains for a receive path 630 associated with the SUB1 and a receive path 635 associated with the SUB2.

In some examples, the UE 115 may receive the first signaling associated with the SUB1 and the second signaling associated with the SUB2 via an antenna 605 of the UE 115 and may pass the signaling to components of a front-end module (FEM) 610. For example, the UE 115 may receive the signaling associated with both of the SUB1 and the SUB2 and may pass the signaling to the LNA 615 (e.g., an LNA that is shared between the SUB1 and the SUB2 and that is external to a transceiver 695 of the UE 115). In some aspects, the transceiver 695 may be an example of a wireless transceiver (WTR) or a transceiver chip. In some implementations, the UE 115 may set a gain for the LNA 615 in accordance with an AGC feedback loop that references signaling associated with a priority SUB which, for purpose of example, may be understood as the SUB1.

As such, as part of the AGC feedback loop for setting the gain for the LNA 615 (which may be referred to herein as an LNA gain or an LNA GS), the UE 115 may split the first signaling associated with the SUB1 from the second signaling associated with the SUB2 via a splitter 620, may pass the first signaling associated with the SUB1 through a multiplexer 625 (which may also function as a demultiplexer), and may determine a SUB1 GS based on passing the first signaling through the receive path 630. The receive path 630 may be an example of a BBF path 315, a BBF path 415, or a receive path 520 (as shown in FIGS. 3, 4, and 5 respectively) and may include an internal LNA 640-*a*, a mixer 645-*a*, a low-pass filter 650-*a*, an I/Q demodulation step, an ADC 655-*a*, a wideband (WB) filter 660-*a*, and a narrowband (NB) filter 665-*a*. The UE 115 may output the processing of the first signaling from the receive path 630 to a bus 670 and may output information relating to the processed first signaling from the bus 670 to a Q6 processing block 675 including a GS determination component for the SUB1 and a GS determination component for the SUB2.

In some implementations, the UE 115 may determine, as an output of the GS determination component for the SUB1, the SUB1 GS (which may be equivalently referred to or understood as a SUB1 system GS) based on an RSSI of the first signaling associated with the SUB1. The UE 115, as a result of determining the SUB1 GS based on the RSSI of the first signaling, may input the SUB1 GS into a transceiver unit 680 and may determine or otherwise obtain, as an output of the transceiver unit 680, a SUB1 LNA GS (e.g., a gain for the LNA 615 based on the first signaling associated with the SUB1). The UE 115 may input the SUB1 LNA GS into a radio frequency front-end (RFFE) component 690 and determine or otherwise obtain, as an output of the RFFE component 690, the LNA GS for the LNA 615. As such, the UE 115 may set the gain for the LNA 615 based on the first signaling associated with the SUB1 such that the SUB1 may effectively control the LNA 615.

The UE 115 may determine receive gain states for each of the receive path 630 associated with the SUB1 and the receive path 635 associated with the SUB2. The UE 115, to determine a first receive gain state for the receive path 630 associated with the SUB1 (which may be equivalently referred to herein as a SUB1 WTR GS), may determine or obtain a second output from the transceiver unit 680 (in addition to the SUB1 LNA GS) based on inputting the SUB1 GS, input that second output into a transceiver engine 685, and determine or otherwise obtain, as an output of the transceiver engine 685, the SUB1 WTR GS. Accordingly, the UE 115 may set the first receive gain state for the receive path 630 associated with the SUB1 using the SUB1 WTR GS.

The UE 115, to determine a second receive gain state for the receive path 635 associated with the SUB2 (which may be equivalently referred to herein as a SUB2 WTR GS), may, with similarity to the processing of the first signaling associated with the SUB1, pass the second signaling associated with the SUB2 to the receive path 635 via the splitter 620 and the multiplexer 625. The UE 115 may process the second signaling via the receive path 635, which may include an internal LNA 640-*b*, a mixer 645-*b*, a low-pass filter 650-*b*, an I/Q demodulation step, an ADC 655-*b*, a WB filter 660-*b*, and an NB filter 665-*b*. Based on receiving the second signaling via the receive path 635, the UE 115 may pass information relating to the processed second signaling to the Q6 processing block 675 including the GS determination component for the SUB1 and the GS determination component for the SUB2 via the bus 670.

The UE 115 may determine a SUB2 GS based on an RSSI of the second signaling associated with the SUB2 and based on the LNA GS that is set for the LNA 615. For example, in some implementations, the UE 115 may readback the LNA GS that is set for the LNA 615 from the transceiver unit 680 to the GS determination component for the SUB1, the GS determination component for the SUB1 may signal the LNA GS to the GS determination component for the SUB2, and the UE 115 may determine, as an output of the GS determination component for the SUB2, the SUB2 GS that is based on the RSSI of the second signaling and that also accounts for (e.g., adjusts from) the LNA GS set for the LNA 615. The UE 115 may input the SUB2 GS into the transceiver unit 680, determine a third output of the transceiver unit 680 based on inputting the SUB2 GS, and input the third output of the transceiver unit 680 into the transceiver engine 685 to determine the SUB2 WTR GS. Accordingly, the UE 115 may set the second receive gain state for the receive path 635 associated with the SUB2 using the SUB2 WTR GS.

As such, the UE 115 may set the LNA 615 with an LNA GS controlled by the SUB1 (e.g., the priority SUB), may set the receive path 630 associated with the SUB1 with a SUB1 WTR GS based on a SUB1 GS (which is based on an RSSI of the first signaling), and may set the receive path 635 associated with the SUB2 with a SUB2 WTR GS based on a SUB2 GS (which is based on both an RSSI of the second signaling and the LNA GS). In accordance with such an AGC feedback loop, the LNA GS of the LNA 615 may change as an RSSI of the SUB1 changes and may remain constant if an RSSI of the SUB1 remains constant (even if an RSSI of the SUB2 changes). Further, although described in the context of the antenna 605 (e.g., one antenna), the UE 115 may perform similar procedures for any number of antennas (and any number of corresponding FEMs and receive paths). For example, the UE 115 may similarly set an external LNA GS and internal receive path GSs for four antennas (e.g., for four FEMs and four pairs of receive paths).

In some implementations of the present disclosure, the UE 115 may support a radio frequency re-configuration from a dual receive DSDA (DR-DSDA) deployment to a mobile DSDA deployment to facilitate the use of a shared LNA via a joint radio re-configuration and retune across the SUB1 and the SUB2. In mobile DSDA, the UE 115 may employ such a joint radio re-configuration to configure both the SUB1 and the SUB2 into a shared LNA configuration involving coordination across the SUB1 and the SUB2 to support awareness of the sharing of the LNA in DSDA modes. In some examples, the shared LNA configuration may further involve a determination of RFFE hardware support for a shared antenna, a shared LNA, and independent paths from a splitter to split the first signaling associated with the SUB1 and the second signaling associated with the SUB2 into two parallel receive paths that the UE 115 may process independently (with respect to demodulation and decoding).

Figure 9:
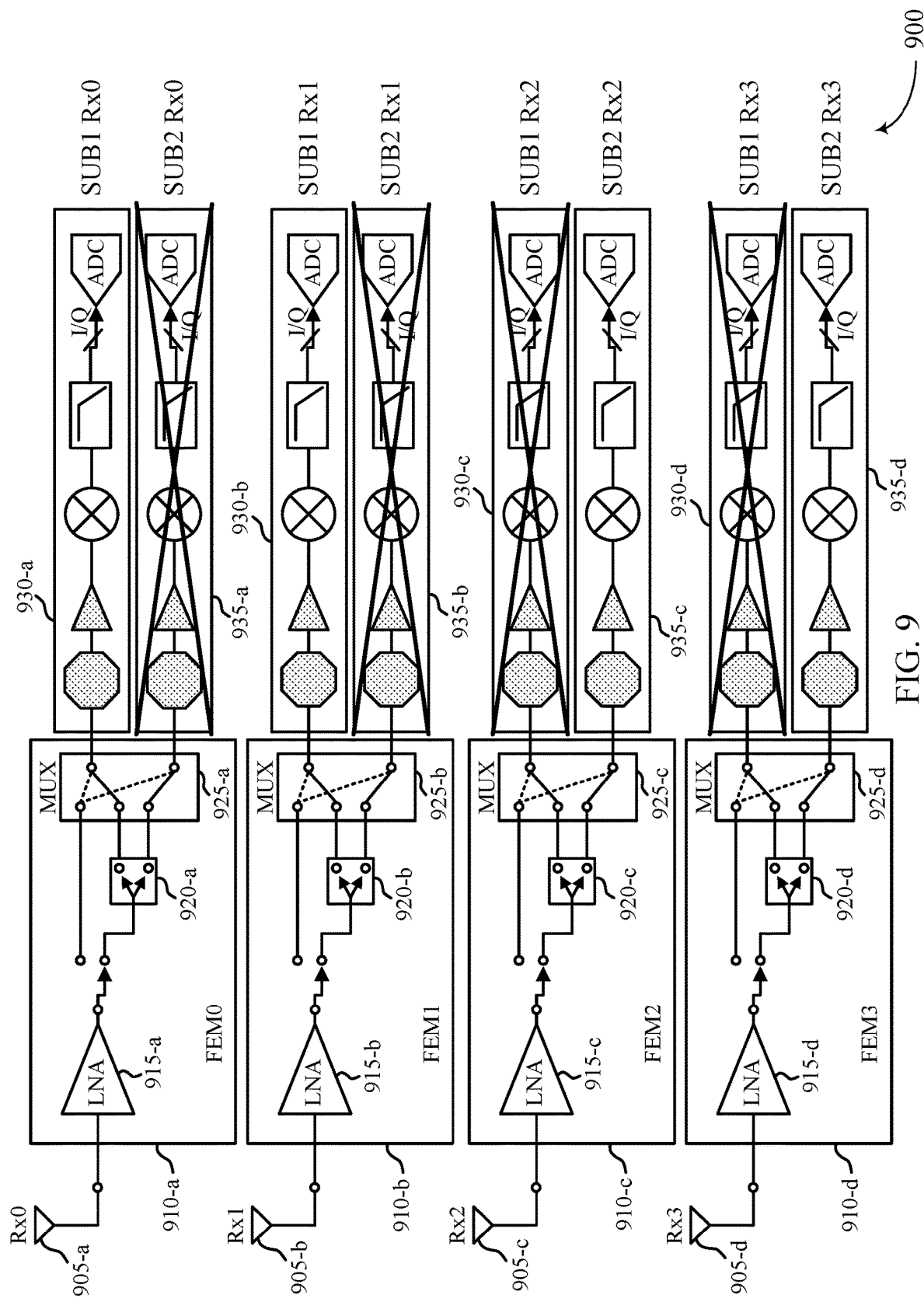

As described in more detail herein, including with reference to FIG. 9, the UE 115 may determine to drop the receiving of the first signaling associated with the SUB1 to a first subset of antennas and the receiving of the second signaling associated with the SUB2 to a second subset of antennas if one or both of the first signaling or the second signaling experiences significant signal degradation (e.g., has an RSSI or a BLER that fails to satisfy a threshold value for a threshold time duration). In such examples, the UE 115 may re-configure its antennas and receive paths to receive one of the first signaling associated with the SUB1 or the second signaling associated with the SUB2 and, likewise, may employ different procedures for setting the relevant gain states for each LNA and receive path.

For example, if the UE 115 drops to receiving the first signaling associated with the SUB1 via a first subset of one or more antennas and drops to receiving the second signaling associated with the SUB2 via a second subset of one or more antennas, the UE 115 may set a gain for each external LNA coupled with the first subset of one or more antennas based on the first signaling and may set a gain for each external LNA coupled with the second subset of one or more antennas based on the second signaling. Similarly, the UE 115 may set a receive gain for each receive path of the first subset of one or more antennas based on the first signaling and may set a receive gain for each receive path of the second subset of one or more antennas based on the second signaling.

In such examples, for instance, the UE 115 may determine, for a first antenna of the first subset of antennas, a SUB1 system GS based on an RSSI of the first signaling received via the first antenna, may input the SUB1 system GS into a transceiver unit to determine, as an output of the transceiver unit, a SUB1 LNA GS, and may input the SUB1 LNA GS into an RFFE component to determine an LNA GS for which to set the external LNA coupled to the first antenna. Additionally, the UE 115 may determine a second output of the transceiver unit related to a receive GS and input the second output into a transceiver engine to determine a SUB1 WTR GS for the receive path of the first antenna.

Similarly, the UE 115 may determine, for a second antenna of the second subset of antennas, a SUB2 system GS based on an RSSI of the second signaling received via the second antenna, may input the SUB2 system GS into a transceiver unit to determine, as an output of the transceiver unit, a SUB2 LNA GS, and may input the SUB2 LNA GS into an RFFE component to determine an LNA GS for which to set the external LNA coupled to the second antenna. Additionally, the UE 115 may determine a second output of the transceiver unit related to a receive GS and input the second output into a transceiver engine to determine a SUB2 WTR GS for the receive path of the second antenna. As such, the UE 115 may operate separate AGC feedback loops for each SUB without communication between the SUBs. In some implementations, the UE 115 may resume receiving both the first signaling associated with the SUB1 and the second signaling associated with the SUB2 if the UE 115 detects that the RSSI or the BLER of the first signaling or the second signaling satisfies the threshold value (e.g., if channel conditions improve) and, likewise, may resume the joint LNA AGC management illustrated by FIG. 6.

Figure 7:
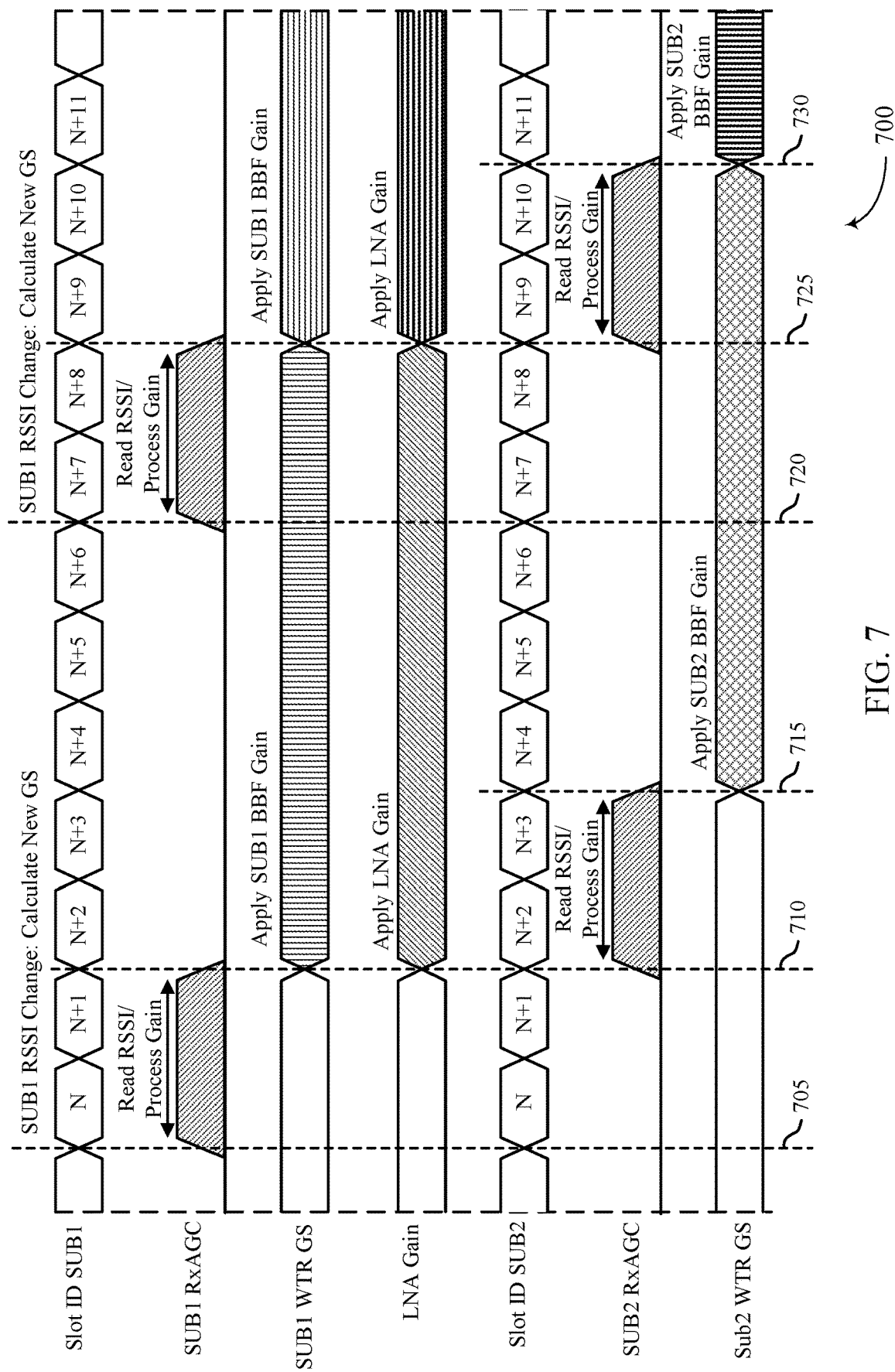
FIG. 7 illustrates an example of a processing timeline that supports techniques for managing a shared LNA AGC in DSDA deployments in accordance with various aspects of the present disclosure.

FIG. 7 illustrates an example of a processing timeline 700 that supports techniques for managing a shared LNA AGC in DSDA deployments in accordance with various aspects of the present disclosure. The processing timeline 700 may implement or be implemented to realize aspects of the wireless communications system 100 or the wireless communications system 200. For example, a UE 115, which may be an example of corresponding devices described herein, may implement the LNA AGC management techniques of the present disclosure according to the processing timeline 700. In some examples, the UE 115 may manage LNA AGC for an LNA coupled with an antenna that is shared between first signaling associated with a first network subscription (e.g., a SUB1) and second signaling associated with a second network subscription (e.g., a SUB2) and to manage gains for a first receive path of the antenna associated with the SUB1 and a second receive path of the antenna associated with the SUB2.

At 705, the UE 115, as part of a SUB1 receive path AGC (RxAGC) gain estimation, may average an RSSI of the first signaling associated with the SUB1 received over the first receive path at slot N and may process the averaged RSSI at slot N+1. In some examples, the UE 115 may detect that the SUB1 RSSI changed (e.g., from a previous averaging over a previous slot) and may determine or calculate new gains for the SUB1.

At 710, in such examples in which the UE 115 determines or calculates a new GS for the SUB1, the UE 115 may apply the newly calculated gains at slot N+2. For example, the UE 115 may apply a newly calculated SUB1 BBF gain (e.g., a receive path GS for the first receive path or a SUB1 WTR GS) and a newly calculated LNA gain at slot N+2. If the SUB1 changes the external LNA GS at slot N+2, the SUB2 RxAGC gain estimation may begin and the UE 115 may compute a new SUB2 BBF gain (e.g., a receive path GS for the second receive path or a SUB2 WTR GS) based on the newly calculated LNA gain.

At 715, the SUB2 may apply the newly calculated SUB2 BBF gain for the second receive path at slot N+4. In some examples, and based on applying the newly calculated receive path GS for the second receive path at slot N+4, the SUB2 may experience transient degradation for two slots (e.g., for the two slots between the slot N+2 when the SUB1 applies new GSs and the slot N+4 when the SUB2 updates its receive path GS to account for the new SUB1 GSs). In some examples, a modem of the UE 115 may monitor an RSSI or a BLER of the second signaling and, if the modem of the UE 115 continues to detect an RSSI or a BLER that fails to satisfy a threshold value after a recovery period (e.g., for longer than two slots), the UE 115 may downgrade the SUB1 and the SUB2 from receiving the SUB1 and the SUB 2 via four antennas (e.g., 4×4 Rx) to receiving the SUB1 and the SUB2 via smaller subsets of antennas (e.g., 2×2 Rx) (or from 2×2 Rx to 1×1 Rx).

At 720, the UE 115, as part of the SUB1 RxAGC gain estimation, may again average an RSSI of the first signaling associated with the SUB1 received over the first receive path at slot N+7 and may process the averaged RSSI at slot N+8. In some examples, the UE 115 may detect that the SUB1 RSSI changed (e.g., from the previous average RSSI calculated at slot N+1) and may determine or calculate new gains for the SUB1.

At 725, in examples in which the UE 115 determines or calculates a new GS for the SUB1, the UE 115 may apply the newly calculated gains at slot N+9. For example, the UE 115 may apply a newly calculated SUB1 BBF gain (e.g., a receive path GS for the first receive path or a SUB1 WTR GS) and a newly calculated LNA gain at slot N+9. If the SUB1 changes the external LNA GS at slot N+9, the SUB2 RxAGC gain estimation may begin and the UE 115 may compute a new SUB2 BBF gain (e.g., a receive path GS for the second receive path or a SUB2 WTR GS) based on the newly calculated LNA gain.

At 730, the SUB2 may apply the newly calculated SUB2 BBF gain for the second receive path at slot N+11. In some examples, and based on applying the newly calculated receive path GS for the second receive path at slot N+11, the SUB2 may experience transient degradation for two slots (e.g., for the two slots between the slot N+9 when the SUB1 applies new GSs and the slot N+11 when the SUB2 updates its receive path GS to account for the new SUB1 GSs). In some examples, the modem of the UE 115 may monitor an RSSI or a BLER of the second signaling and, if the modem of the UE 115 continues to detect an RSSI or a BLER that fails to satisfy a threshold value after a recovery period (e.g., two slots), the UE 115 may downgrade the SUB1 and the SUB2 from receiving the SUB1 and the SUB 2 via four antennas (e.g., 4×4 Rx) to receiving the SUB1 and the SUB2 via smaller subsets of antennas (e.g., 2×2 Rx) (or from 2×2 Rx to 1×1 Rx).

Further, the processing timeline 700 illustrates examples in which slots associated with the SUB1 and the SUB2 are aligned in time (e.g., are synchronous) for purpose of example, and the slots associated with the SUB1 and the SUB2 may be asynchronous without exceeding the scope of the present disclosure. Additionally, for purpose of example, the processing timeline 700 covers examples in which the SUB2 does not request a GS change (e.g., a GS change to the external LNA controlled by the SUB1).

Figure 8:
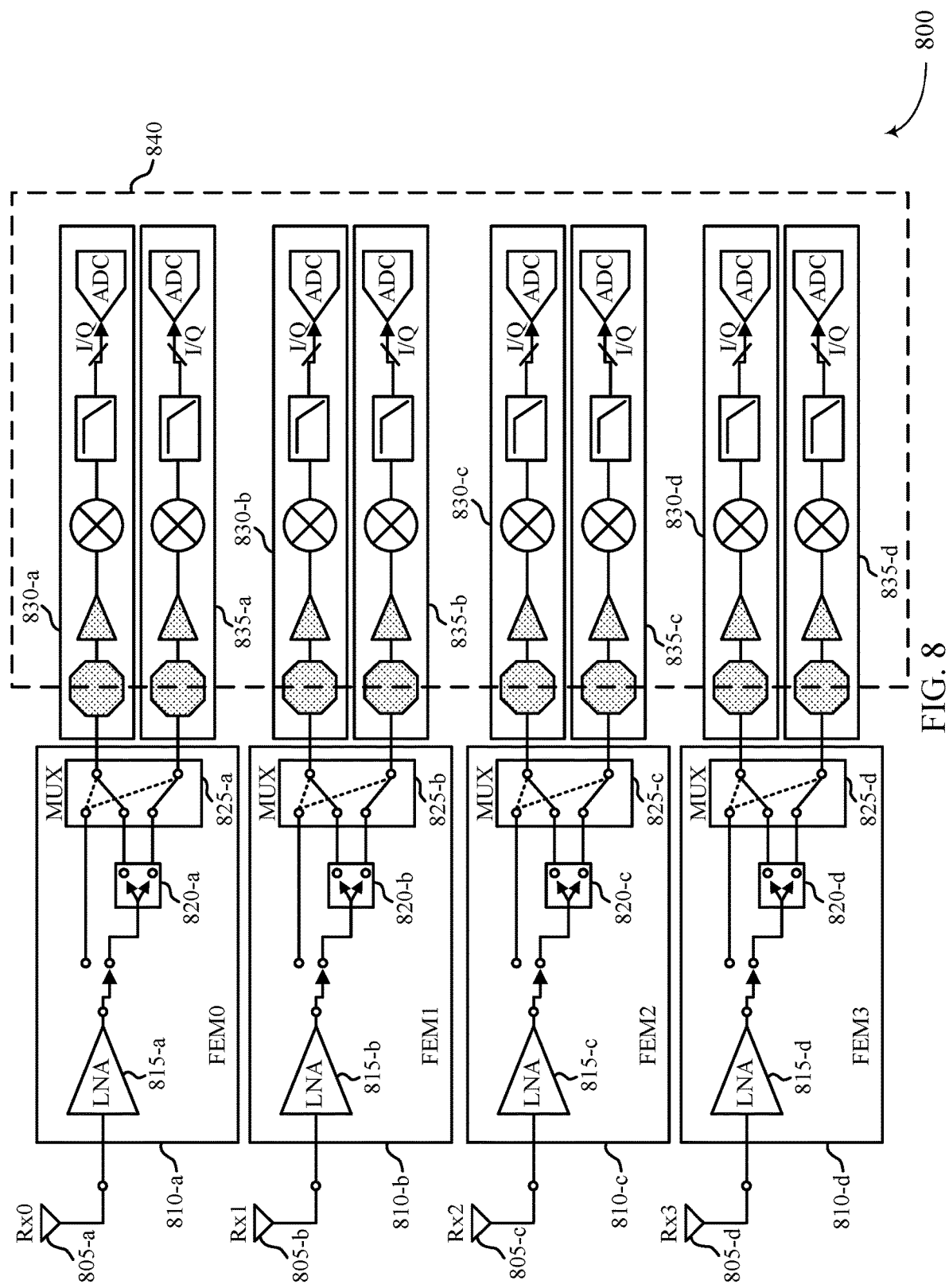
FIGS. 8 through 10 illustrate examples of signal processing diagrams that support techniques for managing a shared LNA AGC in DSDA deployments in accordance with various aspects of the present disclosure.

FIG. 8 illustrates an example of a signal processing diagram 800 that supports techniques for managing a shared LNA AGC in DSDA deployments in accordance with various aspects of the present disclosure. The signal processing diagram 800 may implement or be implemented to realize aspects of the wireless communications system 100 or the wireless communications system 200. For example, a UE 115, which may be an example of corresponding devices described herein, may perform the operations of the signal processing diagram 800 to manage LNA AGC for a set of LNAs 815 that are shared between first signaling associated with a first network subscription (e.g., a SUB1) and second signaling associated with a second network subscription (e.g., a SUB2) and to manage gains for a set of receive paths 830 associated with the SUB1 and a set of receive paths 835 associated with the SUB2.

In some examples, the signal processing diagram 800 may illustrate an extension of the signal processing diagram 500 and the signal processing diagram 600 (as shown in FIGS. 5 and 6, respectively) to a set of (e.g., four) antennas 805, each of the set of antennas 805 coupled with an LNA and a pair of receive paths (e.g., a first receive path for receiving the first signaling associated with the SUB1 and a second receive path for receiving the second signaling associated with the SUB2) within a transceiver 840 of the UE 115. For example, the UE 115 may operate an antenna 805-*a* (e.g., an Rx0) coupled with an FEM 810-*a* (e.g., an FEM0) including an LNA 815-*a*, a splitter 820-*a*, and a multiplexer 825-*a* and featuring a receive path 830-*a* associated with the SUB1 and a receive path 835-*a* associated with the SUB2. Additionally or alternatively, the UE 115 may operate an antenna 805-*b* (e.g., an Rx1) coupled with an FEM 810-*b* (e.g., an FEM1) including an LNA 815-*b*, a splitter 820-*b*, and a multiplexer 825-*b* and featuring a receive path 830-*b* associated with the SUB1 and a receive path 835-*b* associated with the SUB2.

Additionally or alternatively, the UE 115 may operate an antenna 805-*c* (e.g., an Rx2) coupled with an FEM 810-*c* (e.g., an FEM1) including an LNA 815-*c*, a splitter 820-*c*, and a multiplexer 825-*c* and featuring a receive path 830-*c* associated with the SUB1 and a receive path 835-*c* associated with the SUB2. Additionally or alternatively, the UE 115 may operate an antenna 805-*d* (e.g., an Rx3) coupled with an FEM 810-*d* (e.g., an FEM1) including an LNA 815-*d*, a splitter 820-*d*, and a multiplexer 825-*d* and featuring a receive path 830-*d* associated with the SUB1 and a receive path 835-*d* associated with the SUB2.

Some RFFE components, such as the FEMs 810, may support a passive low noise split used for single-SIM non-contiguous carrier aggregation (NCCA). For example, two carriers may share an LNA and may be split from one another via a splitter such that the UE 115 may receive each carrier over a different receive chain (e.g., via a Port_1 and a Port_2). In some examples, the UE 115 may reuse the NCCA low noise split for co-banded multi-SIM DSDA deployments. In such examples, for instance, the UE 115 may reuse the low noise split such that, instead of receiving the two carriers from a same network or base station 105, the UE 115 may receive the two carriers from different networks or base stations (e.g., different service providers).

Accordingly, the UE 115 may configure the FEMs (e.g., the split) based on whether the UE 115 is supporting single-SIM operation or multi-SIM operation. For example, if the UE 115 supports single-SIM operation, the UE 115 may configure the FEM such that the received signaling bypasses a splitter. Alternatively, if the UE 115 supports multi-SIM operation or DSDA, the UE 115 may configure the FEM such that the received signaling passes through the splitter (e.g., such that the FEM is in a split mode). In some examples, the UE 115 may perform a joint retune to re-program the LNA when transitioning between single-SIM operation and a DSDA mode.

In some implementations of the present disclosure, the UE 115 may control a gain for each of the set of LNAs 815 and a receive gain state for each of the receive paths 830 based on the first signaling associated with the SUB1 (if the SUB1 is a priority SUB) and may control a receive gain state for each of the receive paths 835 based on the second signaling associated with the SUB2 and the gain for the corresponding LNA of the set of LNAs 815. With such shared LNA AGC management, both the SUB1 and the SUB2 may operate in a 4 Rx mode with a relatively larger RSSI delta while still using shared front-end resources.

In some examples, such as in examples in which the UE 115 detects that a signal quality of the second signaling associated with the SUB2 fails to satisfy a threshold for a threshold time duration (e.g., such as for longer than two slots, as described with reference to FIG. 7), the UE 115 may re-configure the receiving of the first signaling and the second signaling. For example, the UE 115 may drop or reduce the receiving of the first signaling to a first subset of the set of antennas 805 (e.g., such as to the antenna 805-*a* and to the antenna 805-*b*) and may drop or reduce the receiving of the second signaling to a second subset of the set of antennas 805 (e.g., such as to the antenna 805-*c* and to the antenna 805-*d*). Such a dropping or reducing of the receiving of the first signaling and the second signaling to respective subsets of the set of antennas 805 is illustrated by and described in more detail with reference to FIG. 9.

FIG. 9 illustrates an example of a signal processing diagram 900 that supports techniques for managing a shared LNA AGC in DSDA deployments in accordance with various aspects of the present disclosure. The signal processing diagram 900 may implement or be implemented to realize aspects of the wireless communications system 100 or the wireless communications system 200. For example, a UE 115, which may be an example of corresponding devices described herein, may perform the operations of the signal processing diagram 900 to manage LNA AGC for a set of LNAs 915 after a dropping of the receiving of first signaling associated with a first network subscription (e.g., a SUB1) and a dropping of the receiving of second signaling associated with a second network subscription (e.g., a SUB2) to different subsets of a set of antennas 905 of the UE 115.

In some implementations, for example, a modem of the UE 115 may detect or otherwise determine whether a performance of any SUB supported by the UE 115 is getting degraded, suffering from adverse channel conditions, or is otherwise not being received with a sufficient signal quality and, if the modem detects such a performance degradation, the modem of the UE 115 may re-configure (or instruct a re-configuration) of the operation of the antennas 905 of the UE 115. For instance, if the modem of the UE 115 detects that the first signaling associated with the SUB1 or the second signaling associated with the SUB2 has an RSSI or a BLER that fails to satisfy a threshold (for a threshold duration), the UE 115 may drop the receiving order of the SUB1 from 4×4 Rx to 2×2 Rx (or from 2×2 Rx to 1×1 Rx) or may drop the receiving order of the SUB2 from 4×4 Rx to 2×2 Rx (or from 2×2 Rx to 1×1 Rx), or both.

For example, in scenarios in which the UE 115 operates the SUB1 and the SUB2 in the 4×4 Rx mode (as shown in FIG. 9), the UE 115 may drop the receiving of the first signaling associated with the SUB1 from the set of antennas 905 to receiving the first signaling associated with SUB1 via a subset of antennas including an antenna 905-*a* and an antenna 905-*b* and may drop the receiving of the second signaling associated with the SUB2 from the set of antennas 905 to receiving the second signaling associated with SUB2 via a subset of antennas including an antenna 905-*c* and an antenna 905-*d*. As such, the UE 115 may let the SUB2 take over control of the two LNA paths coupled with the antenna 905-*c* and the antenna 905-*d* and the SUB1 may remain in control of the two LNA paths coupled with the antenna 905-*a* and the antenna 905-*b*.

In some examples, the LNAs coupled with the set of antennas 905 may remain in a split mode (such that the signaling is routed to a multiplexer via a splitter), but the receive paths corresponding to the dropped SUB may be blanked or tuned away. In other words, the two non-operational receive chains of the SUB1 and the SUB2 may be blanked or tuned away. In some examples, the UE 115 may select or otherwise determine whether to blank or tune away a non-operational receive chain based on the channel conditions in the field. For example, in some cases, a gain delta between the operational and non-operational receive chains may exceed a threshold (e.g., an upper limit or allowable threshold) if the first SUB1 uses a relatively high gain mode while the SUB2 uses bypass and blanking is used. As such, if the first SUB1 uses a relatively high gain mode while the SUB2 uses bypass, the UE 115 may select to tune away the non-operational receive chains to avoid such a large gain delta from developing. In some aspects (such as if dropping DLQ to DLP), regardless of the dropping of the receiving and the blanking or the tuning away of non-operational receive paths, the UE 115 may keep internal LNAs operating to ensure that impedance through the transceiver of the UE 115 remains the same.

Accordingly, in an example, after the dropping, the UE 115 may receive the first signaling associated with the SUB1 via the antenna 905-*a* (e.g., an Rx0) coupled with an FEM 910-*a* (e.g., an FEM0) including an LNA 915-*a*, a splitter 920-*a*, and a multiplexer 925-*a* and featuring a receive path 930-*a* associated with the SUB1 and a receive path 935-*a* associated with the SUB2, and the UE 115 may blank the receive path 935-*a* or tune the receive path 935-*a* away from the second signaling associated with the SUB2. Similarly, after the dropping, the UE 115 may also receive the first signaling associated with the SUB1 via the antenna 905-*b* (e.g., an Rx1) coupled with an FEM 910-*b* (e.g., an FEM1) including an LNA 915-*b*, a splitter 920-*b*, and a multiplexer 925-*b* and featuring a receive path 930-*b* associated with the SUB1 and a receive path 935-*b* associated with the SUB2, and the UE 115 may blank the receive path 935-*b* or tune the receive path 935-*b* away from the second signaling associated with the SUB2.

Additionally, after the dropping, the UE 115 may receive the second signaling associated with the SUB2 via the antenna 905-*c* (e.g., an Rx2) coupled with an FEM 910-*c* (e.g., an FEM2) including an LNA 915-*c*, a splitter 920-*c*, and a multiplexer 925-*c* and featuring a receive path 930-*c* associated with the SUB1 and a receive path 935-*c* associated with the SUB2, and the UE 115 may blank the receive path 930-*c* or tune the receive path 930-*c* away from the first signaling associated with the SUB1. Similarly, after the dropping, the UE 115 may receive the second signaling associated with the SUB2 via the antenna 905-*d* (e.g., an Rx3) coupled with an FEM 910-*d* (e.g., an FEM3) including an LNA 915-*d*, a splitter 920-*d*, and a multiplexer 925-*d* and featuring a receive path 930-*d* associated with the SUB1 and a receive path 935-*d* associated with the SUB2, and the UE 115 may blank the receive path 930-*d* or tune the receive path 930-*d* away from the first signaling associated with the SUB1.

Figure 10:
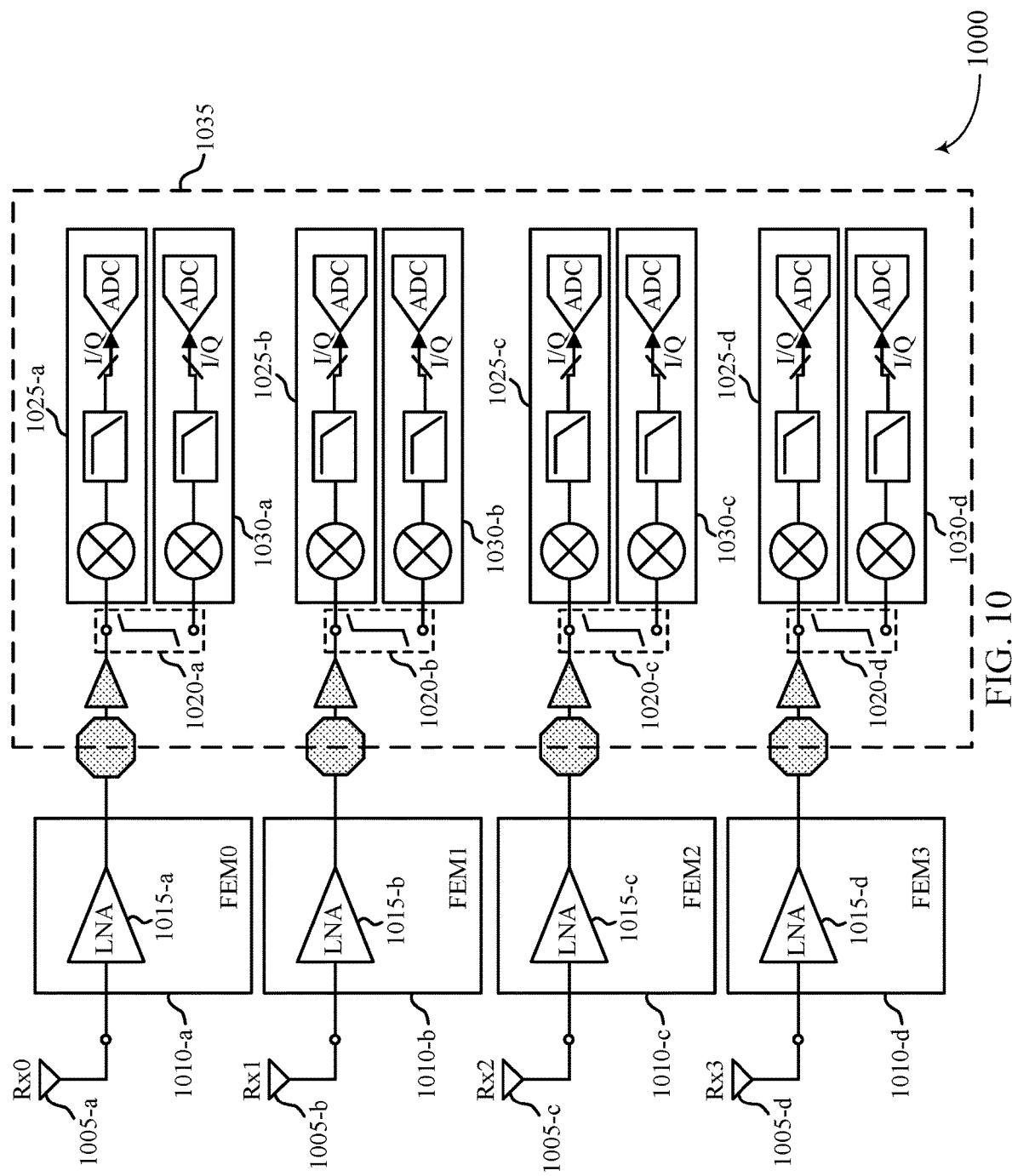

FIG. 10 illustrates an example of a signal processing diagram 1000 that supports techniques for managing a shared LNA AGC in DSDA deployments in accordance with various aspects of the present disclosure. The signal processing diagram 1000 may implement or be implemented to realize aspects of the wireless communications system 100 or the wireless communications system 200. For example, a UE 115, which may be an example of corresponding devices described herein, may perform the operations of the signal processing diagram 1000 to manage LNA AGC for a set of LNAs 1015 that are shared between first signaling associated with a first network subscription (e.g., a SUB1) and second signaling associated with a second network subscription (e.g., a SUB2) and to manage gains for a set of receive paths 1025 associated with the SUB1 and a set of receive paths 1030 associated with the SUB2.

In some examples, the signal processing diagram 1000 may illustrate examples of the present disclosure in which the UE 115 employs an internal LNA split to split the first signaling associated with the SUB1 from the second signaling associated with the SUB2 internal to a transceiver 1035 of the UE 115. For example, the UE 115 may operate a set of antennas 1005, each of the set of antennas 1005 coupled with an LNA and a pair of receive paths (e.g., a first receive path for receiving the first signaling associated with the SUB1 and a second receive path for receiving the second signaling associated with the SUB2) within the transceiver 1035 of the UE 115, and the first signaling and the second signaling may be split towards the first receive path and the second receive path, respectively, after an internal LNA within the transceiver 1035.

For example, the UE 115 may operate an antenna 1005-*a* (e.g., an Rx0) coupled with an FEM 1010-*a* (e.g., an FEM0) including an LNA 1015-*a*, a splitter 1020-*a* that is internal to the transceiver 1035 and featuring a receive path 1025-*a* associated with the SUB1 and a receive path 1030-*a* associated with the SUB2. Additionally or alternatively, the UE 115 may operate an antenna 1005-*b* (e.g., an Rx1) coupled with an FEM 1010-*b* (e.g., an FEM1) including an LNA 1015-*b*, a splitter 1020-*b* that is internal to the transceiver 1035 and featuring a receive path 1025-*b* associated with the SUB1 and a receive path 1030-*b* associated with the SUB2. Additionally or alternatively, the UE 115 may operate an antenna 1005-*c* (e.g., an Rx2) coupled with an FEM 1010-*c* (e.g., an FEM2) including an LNA 1015-*c*, a splitter 1020-*c* that is internal to the transceiver 1035 and featuring a receive path 1025-*c* associated with the SUB1 and a receive path 1030-*c* associated with the SUB2. Additionally or alternatively, the UE 115 may operate an antenna 1005-*d* (e.g., an Rx3) coupled with an FEM 1010-*d* (e.g., an FEM3) including an LNA 1015-*d*, a splitter 1020-*d* that is internal to the transceiver 1035 and featuring a receive path 1025-*d* associated with the SUB1 and a receive path 1030-*d* associated with the SUB2.

In some implementations of the present disclosure, the UE 115 may control a gain for each of the set of LNAs 1015 and a receive gain state for each of the receive paths 1025 based on the first signaling associated with the SUB1 (if the SUB1 is a priority SUB) and may control a receive gain state for each of the receive paths 1030 based on the second signaling associated with the SUB2 and the gain for the corresponding LNA of the set of LNAs 1015.

Further, if the UE 115 refrains from employing an LNA split, the UE 115 may support DSDA by allocating each SUB its own external LNA and receive path. For example, the UE 115 may either operate two receive paths per SUB (e.g., for MB or HB) or double the number of front-end filters to support four receive paths per SUB without an external LNA split. In some aspects, operating in a one receive path mode (e.g., a 1-Rx mode), which may be the case for some LB SUB1+LB SUB2 DSDA co-band, may have relatively large coverage impacts.

Alternatively, if the UE 115 supports an LNA split without a shared LNA AGC management, the UE 115 may use joint AGC management with one or more of the following implementation options. For example, the UE 115 may use joint AGC management if a GS is based on an RSSI of the SUB1 only, avoids communication between the SUBs, features a relatively small or reduced RSSI delta between SUBs, uses a GS based on the SUB1 and the SUB2 (e.g., GS based on a max(SUB1_RSSI,SUB2_RSSI) or a min (SUB1_RSSI, SUB2_RSSI)), or uses communication between the SUBs for each potentially asynchronous slot.

In some aspects, the UE 115, or a detector equipment, may determine which of shared LNA AGC, joint AGC by SUB1 RSSI or min(SUB1_RSSI, SUB2_RSSI), or joint AGC by max(SUB1_RSSI, SUB2_RSSI) is being employed at the UE 115 based on implementing a procedure. Such a procedure may include entering multi-SIM co-banded DSDA, tuning SUB1, and sweeping SUB2. The procedure may also include checking if the UE 115 is in a 4-Rx mode, which the UE 115 or the detector equipment may measure based on a throughput. If the UE 115 is in the 4-Rx mode, the procedure may include setting the SUB1 in a sensitivity range to ensure that the SUB1 GS (e.g., the LNA GS) is in G0, determining that a SUB1 call is up at sensitivity, configuring and tuning the SUB2 such that |SUB2 channel– SUB1 channel|>>max(SUB1_CBW,SUB2_CBW), and sweeping SUB2 RSSI across various values.

As such, the procedure may define a step for determining whether the SUB2 is SNR limited. If the SUB2 is not SNR limited, the UE 115 or the detector equipment may determine that joint AGC by max(SUB1_RSSI, SUB2_RSSI) is being employed at the UE 115. If the SUB2 SNR is limited, the procedure may include determining whether a SUB2 RSSI>>G0 switch-point+backoff. If the UE 115 or the detector equipment determines that the SUB2 RSSI>>G0 switch-point+backoff, the UE 115 or the detector equipment may determine that a shared LNA AGC is being employed at the UE 115. Alternatively, if the UE 115 or the detector equipment determines that the SUB2 RSSI is not>>G0 switch-point+backoff, the UE 115 or the detector equipment may determine that a joint AGC by SUB1 RSSI or min (SUB1_RSSI,SUB2_RSSI) is being employed at the UE 115.

Figure 11:
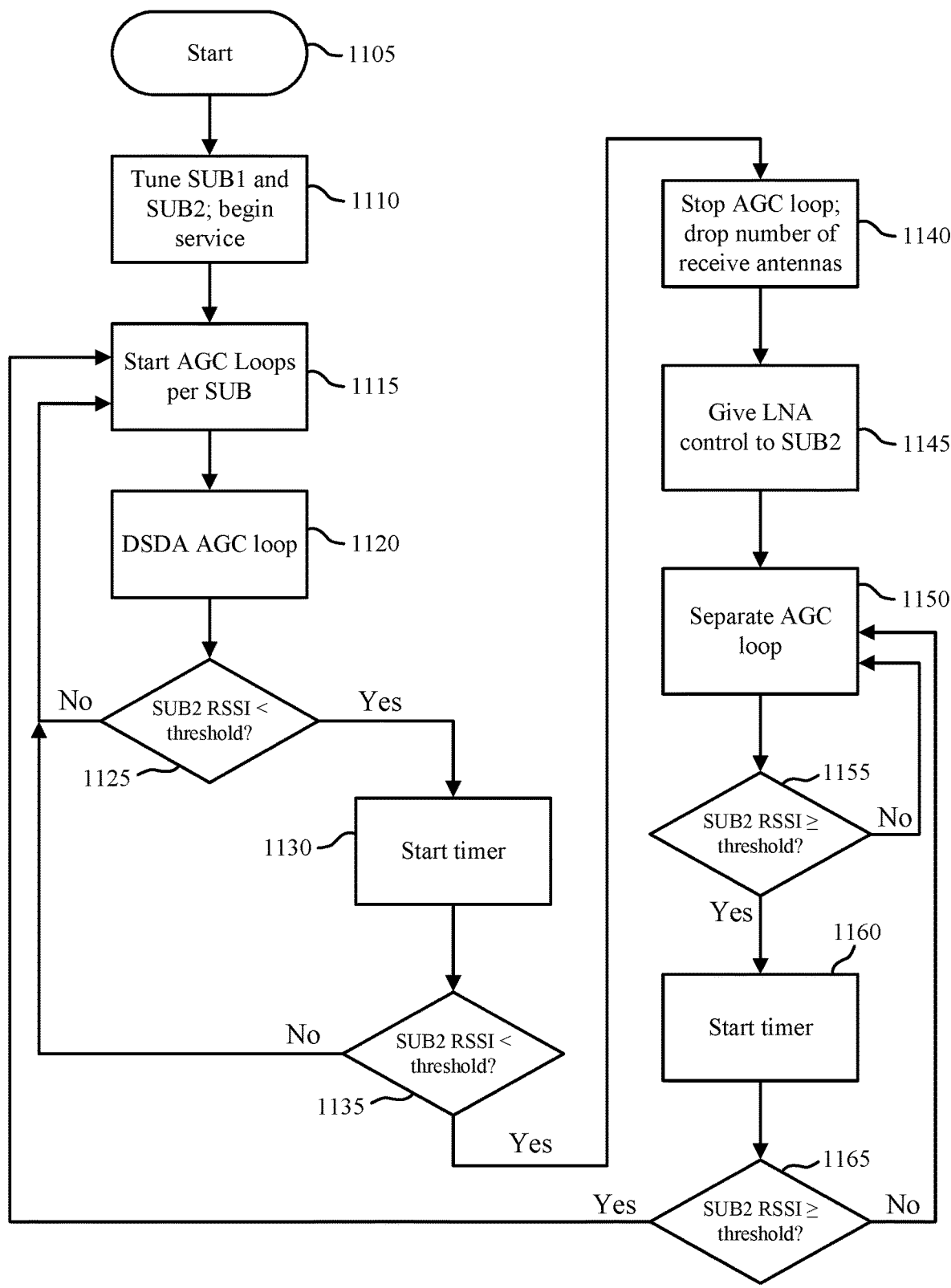
FIGS. 11 through 13 illustrate examples of process flows that support techniques for managing a shared LNA AGC in DSDA deployments in accordance with various aspects of the present disclosure.

FIG. 11 illustrates an example of a process flow 1100 that supports techniques for managing a shared LNA AGC in DSDA deployments in accordance with various aspects of the present disclosure. The process flow 1100 may implement or be implemented to realize aspects of the wireless communications system 100 or the wireless communications system 200. For example, a UE 115, which may be an example of a corresponding device described herein, may perform the operations of the process flow 1100 to manage LNA AGC for an LNA that is shared between first signaling associated with a first network subscription (e.g., a SUB1) and second signaling associated with a second network subscription (e.g., a SUB2) and to manage gains for a first receive path associated with the SUB1 and a second receive path associated with the SUB2.

At 1105, the UE 115 may start the LNA AGC management.

At 1110, the UE 115 may tune the SUB1 and the SUB2 and begin service. For example, the UE 115 may establish both the SUB1 and the SUB2 in connected modes and may initiate service (such as a call or data signaling) with a service provider associated with the SUB1 or the SUB2, or both.

At 1115, the UE 115 may start a number of AGC loops per SUB.

At 1120, the UE 115 may perform a DSDA AGC loop for both the SUB1 and the SUB2 to determine gains (e.g., updated or new gains) for one or more external LNAs and one or more pairs of receive paths for receiving the first signaling associated with the SUB1 and the second signaling associated with the SUB2. The DSDA AGC loop is illustrated by and described in more detail herein, including with reference to FIGS. 6 and 12.

At 1125, the UE 115 may detect or otherwise determine whether an RSSI of the second signaling associated with the SUB2 is less than a threshold RSSI value. If the UE 115 detects that the RSSI of the second signaling is greater than the threshold RSSI value, the UE 115 may start a new set of AGC loops per SUB at 1115. Alternatively, if the UE 115 detects that the RSSI of the second signaling is less than the RSSI threshold value, the UE 115 may start a timer at 1130. In some examples, the timer may span a threshold time duration.

At 1135, the timer may expire and the UE 115 may detect or otherwise determine whether an RSSI of the second signaling associated with the SUB2 is still less than the threshold RSSI value. If the UE 115 detects that the RSSI of the second signaling after expiration of the timer is greater than the threshold RSSI value, the UE 115 may start a new set of AGC loops per SUB at 1115. Alternatively, if the UE 115 detects that the RSSI of the second signaling is still less than the RSSI threshold value after expiration of the timer (e.g., after the threshold time duration), the UE 115 may stop the AGC loop and drop a number of receive antennas at 1140. For example, the UE 115 may drop the receiving of the first signaling associated with the SUB1 to receiving the first signaling via a first subset of antennas and may drop the receiving of the second signaling associated with the SUB2 to receiving the second signaling via a second subset of antennas. Additional details relating to such a dropping of a number of receive antennas are described herein, including with reference to FIG. 9.

At 1145, the UE 115 may give LNA control to the SUB2 for the second subset of antennas from which the first signaling associated with the SUB1 was dropped at 1140. Additional details relating to such a transitioning of LNA control from the SUB1 to the SUB2 for the second subset of antennas are described herein, including with reference to FIG. 9.

At 1150, the UE 115 may perform separate AGC loops for each SUB supported by the UE 115. The separate AGC loop is illustrated by and described in more detail herein, including with reference to FIG. 13.

At 1155, the UE 115 may detect whether the SUB2 RSSI remains less than the RSSI threshold value or if the SUB2 RSSI value currently is equal to or greater than the RSSI threshold value. If the SUB2 RSSI value still remains below the RSSI threshold value, the UE 115 may maintain independent antennas for each SUB supported by the UE 115 and repeat the separate AGC loops at 1150. Alternatively, if the UE 115 detects that the SUB2 RSSI value is greater than or equal to the RSSI threshold value, the UE 115 may start a timer at 1160 and may again compare the SUB2 RSSI value to the RSSI threshold value at 1165.

At 1165, for example, the UE 115 may detect whether the SUB2 RSSI value is still greater than or equal to the RSSI threshold value upon expiration of the timer started at 1160. If the UE 115 detects that the SUB2 RSSI value is below the RSSI threshold value, the UE 115 may maintain independent antennas for each SUB supported by the UE 115 and repeat the separate AGC loops at 1150. Alternatively, if the UE 115 detects that the SUB2 RSSI value remains greater than or equal to the RSSI threshold value after expiration of the timer started at 1160, the UE 115 may resume the receiving of the first signaling associated with the SUB1 and the second signaling associated with the SUB2 with shared antennas and shared LNAs and may start AGC loops per SUB (as shown at 1115). In other words, the UE 115 may return to receiving the first signaling associated with the SUB1 and the second signaling associated with the SUB2 with shared antennas and shared LNAs and may start AGC loops per SUB at 1115.

Figure 12:
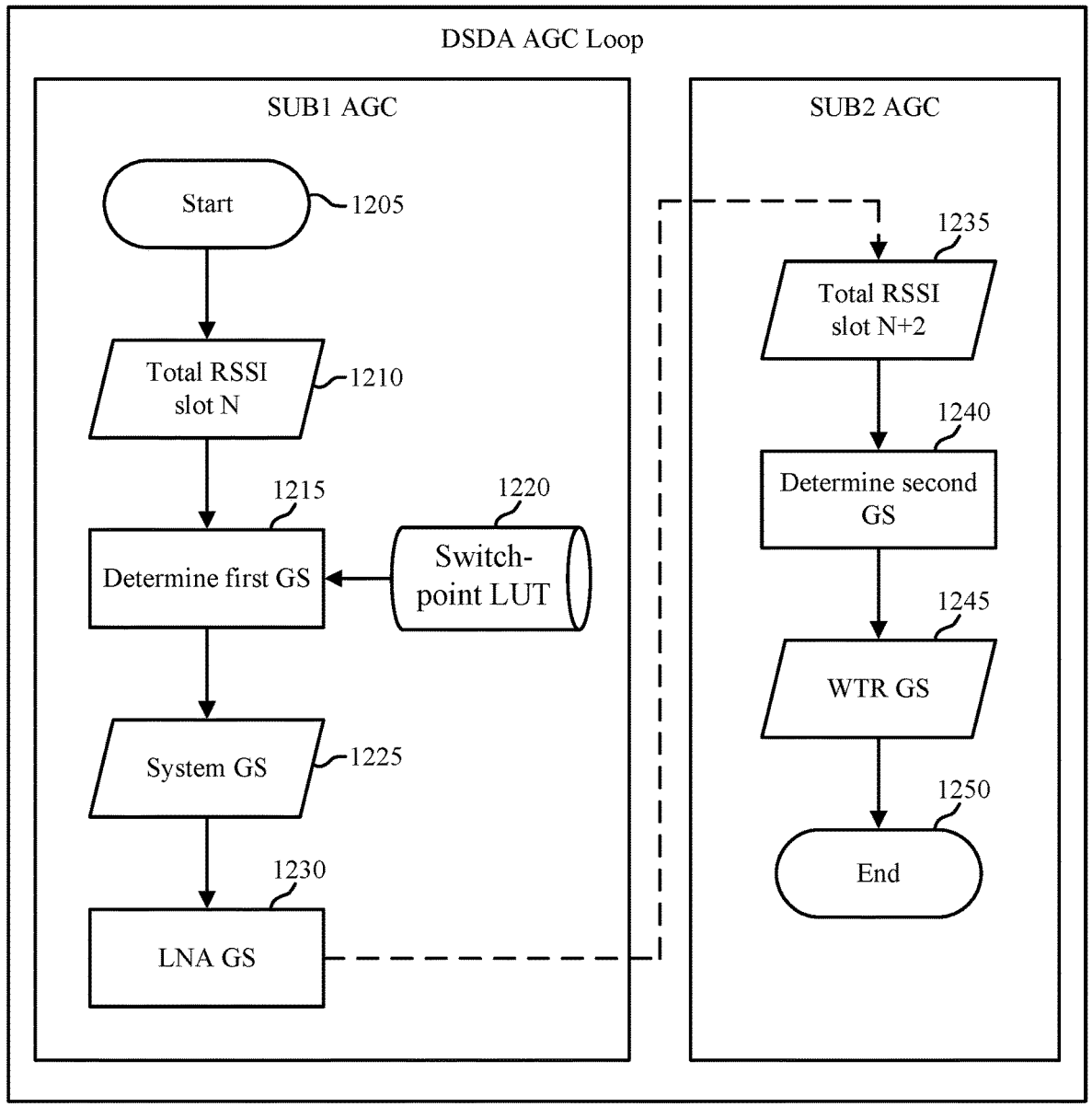

FIG. 12 illustrates an example of a process flow 1200 that supports techniques for managing a shared LNA AGC in DSDA deployments in accordance with various aspects of the present disclosure. The process flow 1200 may implement or be implemented to realize aspects of the wireless communications system 100 or the wireless communications system 200. For example, a UE 115, which may be an example of corresponding devices described herein, may perform the operations of the process flow 1200 as part of a DSDA AGC loop for LNA AGC management.

In some aspects, the process flow 1200 may highlight various operations or steps illustrated and described in more detail herein, including with reference to FIG. 6. In some implementations, a priority SUB (e.g., the SUB1) controls a shared LNA while a non-priority SUB (e.g., the SUB2) reads the shared LNA GS and makes AGC switch-point adjustments to maintain linearity performance prior to ADC processing.

At 1205, the UE 115 may start the DSDA AGC loop at the SUB1.

At 1210, the UE 115 may determine a total RSSI of the first signaling associated with the SUB1 at a slot N. For example, the UE 115 may average an RSSI of the first signaling at the slot N, as described in more detail herein, including with reference to FIG. 7.

At 1215, the UE 115 may determine a first GS for the SUB1 based on the total or averaged RSSI determined at 1210 and based on a switch-point look-up-table (LUT) sampled at 1220.

At 1225, the UE 115 may determine a system GS for the SUB1. In some examples, the UE 115 may use the system GS for the SUB1 to determine a first receive path GS for a first receive path for receiving the first signaling associated with the SUB1.

At 1230, the UE 115 may determine an LNA GS for an external LNA shared between the SUB1 and the SUB2. In some examples, the UE 115 may determine the LNA GS based on the system GS determined at 1225. In some implementations, the UE 115 may readback the LNA GS such that the LNA GS can be read by the SUB2, as illustrated by the dotted line in the process flow 1200.

At 1235, the UE 115 may determine a total RSSI of the second signaling associated with the SUB2 at a slot N+2. For example, the UE 115 may average an RSSI of the second signaling at the slot N+2, as described in more detail herein, including with reference to FIG. 7.

At 1240, the UE 115 may determine a second GS for the SUB2 based on the total (or averaged) RSSI of the second signaling and the readback LNA GS.

At 1245, the UE 115 may determine a WTR GS for a second receive path for receiving the second signaling associated with the SUB2.

At 1250, the UE 115 may end the DSDA AGC loop.

Figure 13:
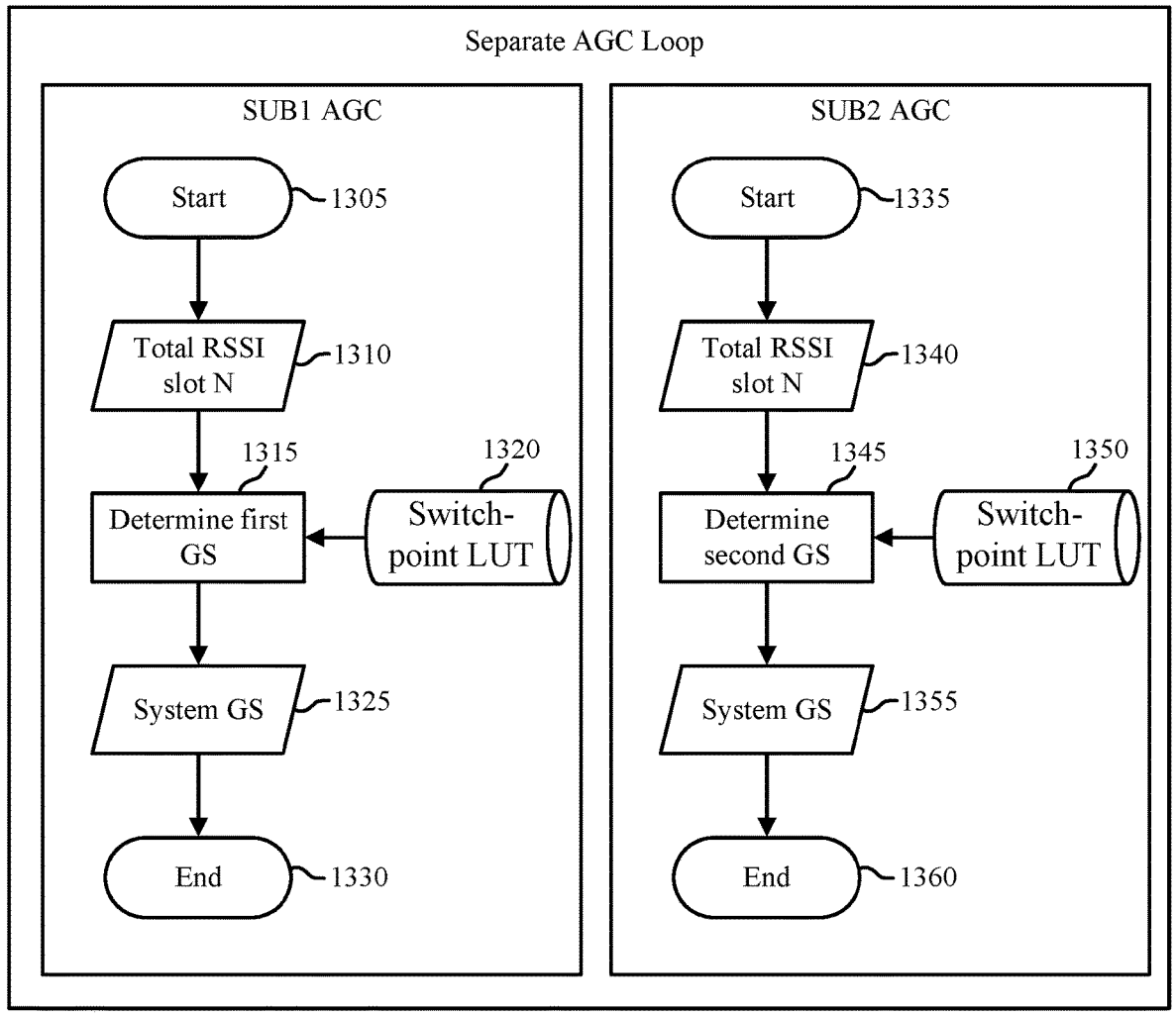

FIG. 13 illustrates an example of a process flow 1300 that supports techniques for managing a shared LNA AGC in DSDA deployments in accordance with various aspects of the present disclosure. The process flow 1300 may implement or be implemented to realize aspects of the wireless communications system 100 or the wireless communications system 200. For example, a UE 115, which may be an example of corresponding devices described herein, may perform the operations of the process flow 1300 as part of a separate AGC loop for LNA AGC management.

At 1305, the UE 115 may start the SUB1 AGC (e.g., separately and independently to the SUB2 AGC).

At 1310, the UE 115 may determine a total RSSI of the first signaling associated with the SUB1 at a slot N. For example, the UE 115 may average an RSSI of the first signaling at the slot N, as described in more detail herein, including with reference to FIG. 7.

At 1315, the UE 115 may determine a first GS for the SUB1 based on the total or averaged RSSI determined at 1310 and based on a switch-point LUT sampled at 1320.

At 1325, the UE 115 determine a system GS for the SUB1. In some examples, the UE 115 may use the system GS for the SUB1 to determine a first receive path GS for a first receive path for receiving the first signaling associated with the SUB1 and for setting an external and independent LNA for the SUB1.

At 1330, the UE 115 may end the independent SUB1 AGC.

At 1335, the UE 115 may start the SUB2 AGC (e.g., separately and independently to the SUB1 AGC).

At 1340, the UE 115 may determine a total RSSI of the second signaling associated with the SUB2 at a slot N. For example, the UE 115 may average an RSSI of the second signaling at the slot N, as described in more detail herein, including with reference to FIG. 7.

At 1345, the UE 115 may determine a second GS for the SUB2 based on the total or averaged RSSI determined at 1340 and based on a switch-point LUT sampled at 1350.

At 1355, the UE 115 determine a system GS for the SUB2. In some examples, the UE 115 may use the system GS for the SUB2 to determine a second receive path GS for a second receive path for receiving the second signaling associated with the SUB2 and for setting an external and independent LNA for the SUB2.

At 1360, the UE 115 may end the independent SUB2 AGC.

Figure 14:
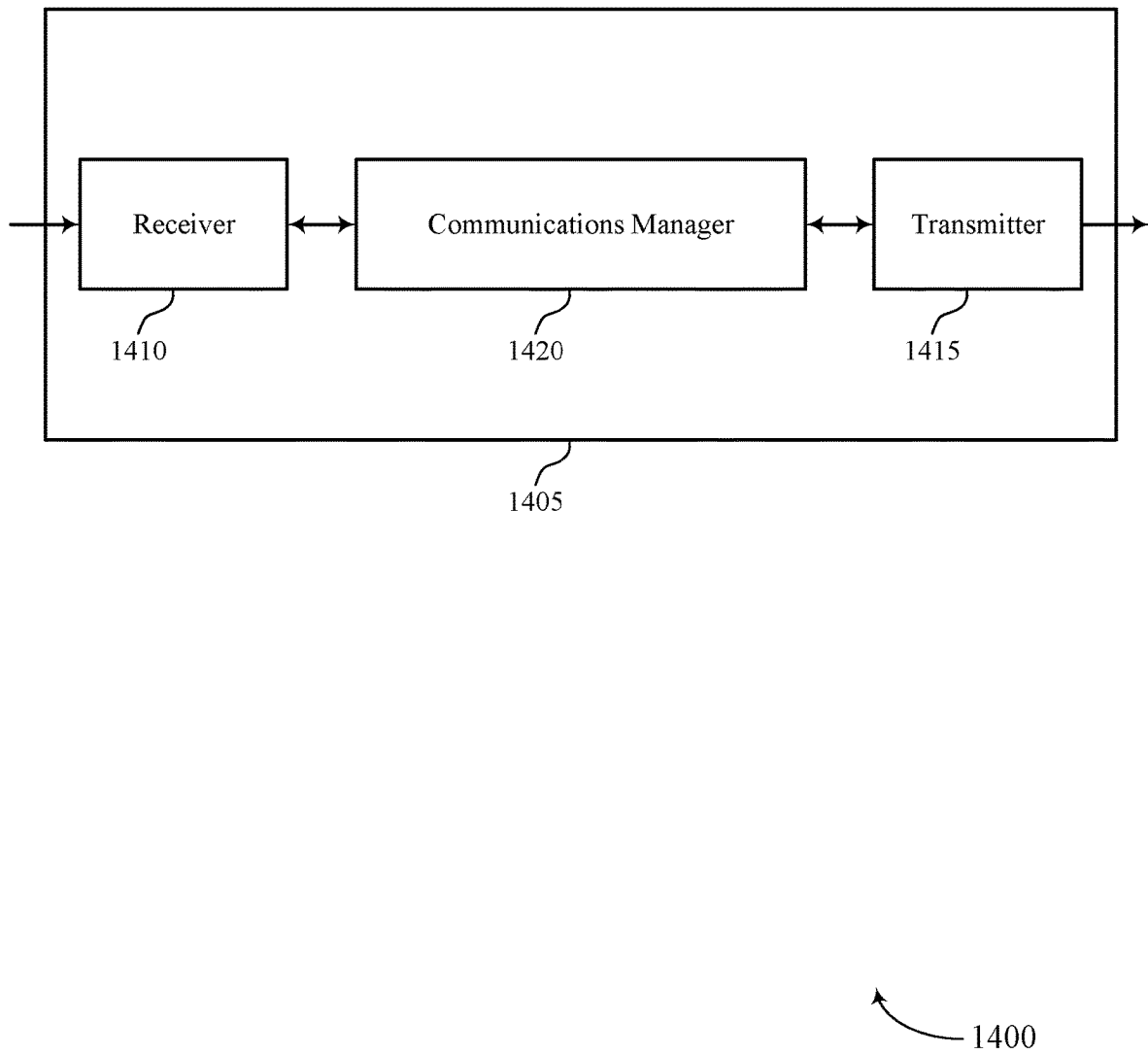
FIGS. 14 and 15 show block diagrams of devices that support techniques for managing a shared LNA AGC in DSDA deployments in accordance with various aspects of the present disclosure.

FIG. 14 shows a block diagram 1400 of a device 1405 that supports techniques for managing a shared LNA AGC in DSDA deployments in accordance with various aspects of the present disclosure. The device 1405 may be an example of aspects of a UE 115 as described herein. The device 1405 may include a receiver 1410, a transmitter 1415, and a communications manager 1420. The device 1405 may also include a processor. Each of these components may be in communication with one another (e.g., via one or more buses).

The receiver 1410 may provide a means for receiving information such as packets, user data, control information, or any combination thereof associated with various information channels (e.g., control channels, data channels, information channels related to techniques for managing a shared LNA AGC in DSDA deployments). Information may be passed on to other components of the device 1405. The receiver 1410 may utilize a single antenna or a set of multiple antennas.

The transmitter 1415 may provide a means for transmitting signals generated by other components of the device 1405. For example, the transmitter 1415 may transmit information such as packets, user data, control information, or any combination thereof associated with various information channels (e.g., control channels, data channels, information channels related to techniques for managing a shared LNA AGC in DSDA deployments). In some examples, the transmitter 1415 may be co-located with a receiver 1410 in a transceiver component. The transmitter 1415 may utilize a single antenna or a set of multiple antennas.

The communications manager 1420, the receiver 1410, the transmitter 1415, or various combinations thereof or various components thereof may be examples of means for performing various aspects of techniques for managing a shared LNA AGC in DSDA deployments as described herein. For example, the communications manager 1420, the receiver 1410, the transmitter 1415, or various combinations or components thereof may support a method for performing one or more of the functions described herein.

In some examples, the communications manager 1420, the receiver 1410, the transmitter 1415, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 1420, the receiver 1410, the transmitter 1415, or various combinations or components thereof may be implemented in code (e.g., as communications management software or firmware) executed by a processor. If implemented in code executed by a processor, the functions of the communications manager 1420, the receiver 1410, the transmitter 1415, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 1420 may be configured to perform various operations (e.g., receiving, monitoring, transmitting) using or otherwise in cooperation with the receiver 1410, the transmitter 1415, or both. For example, the communications manager 1420 may receive information from the receiver 1410, send information to the transmitter 1415, or be integrated in combination with the receiver 1410, the transmitter 1415, or both to receive information, transmit information, or perform various other operations as described herein.

The communications manager 1420 may support wireless communication at a UE in accordance with examples as disclosed herein. For example, the communications manager 1420 may be configured as or otherwise support a means for receiving, via an antenna of the UE, a first signal associated with a first network subscription on a first receive path of the antenna and a second signal associated with a second network subscription on a second receive path of the antenna. The communications manager 1420 may be configured as or otherwise support a means for determining a first GS associated with the first network subscription based on a signal strength of the first signal. The communications manager 1420 may be configured as or otherwise support a means for setting a first gain for a LNA that is coupled with the antenna based on the first GS, where the LNA is shared between first signaling associated with the first network subscription and second signaling associated with the second network subscription.

The communications manager 1420 may be configured as or otherwise support a means for determining a second GS associated with the second network subscription based on a signal strength of the second signal and the first gain for the LNA. The communications manager 1420 may be configured as or otherwise support a means for setting a first receive GS for the first receive path of the antenna associated with the first network subscription based on the first GS. The communications manager 1420 may be configured as or otherwise support a means for setting a second receive GS for the second receive path of the antenna associated with the second network subscription based on the second GS.

By including or configuring the communications manager 1420 in accordance with examples as described herein, the device 1405 (e.g., a processor controlling or otherwise coupled to the receiver 1410, the transmitter 1415, the communications manager 1420, or a combination thereof) may support techniques for reduced processing, reduced power consumption, and more efficient utilization of communication resources.

Figure 15:
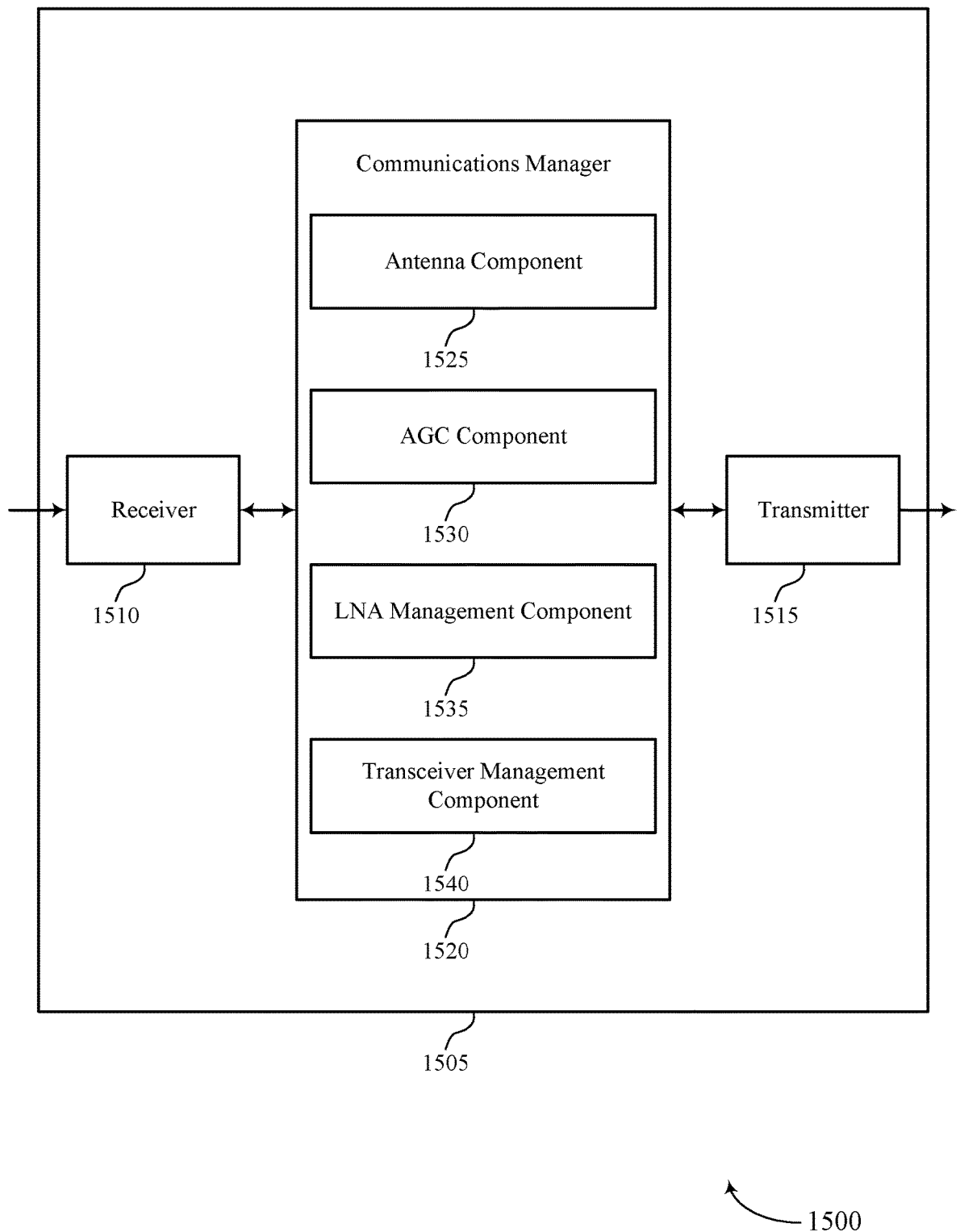

FIG. 15 shows a block diagram 1500 of a device 1505 that supports techniques for managing a shared LNA AGC in DSDA deployments in accordance with various aspects of the present disclosure. The device 1505 may be an example of aspects of a device 1405 or a UE 115 as described herein. The device 1505 may include a receiver 1510, a transmitter 1515, and a communications manager 1520. The device 1505 may also include a processor. Each of these components may be in communication with one another (e.g., via one or more buses).

The receiver 1510 may provide a means for receiving information such as packets, user data, control information, or any combination thereof associated with various information channels (e.g., control channels, data channels, information channels related to techniques for managing a shared LNA AGC in DSDA deployments). Information may be passed on to other components of the device 1505. The receiver 1510 may utilize a single antenna or a set of multiple antennas.

The transmitter 1515 may provide a means for transmitting signals generated by other components of the device 1505. For example, the transmitter 1515 may transmit information such as packets, user data, control information, or any combination thereof associated with various information channels (e.g., control channels, data channels, information channels related to techniques for managing a shared LNA AGC in DSDA deployments). In some examples, the transmitter 1515 may be co-located with a receiver 1510 in a transceiver component. The transmitter 1515 may utilize a single antenna or a set of multiple antennas.

The device 1505, or various components thereof, may be an example of means for performing various aspects of techniques for managing a shared LNA AGC in DSDA deployments as described herein. For example, the communications manager 1520 may include an antenna component 1525, an AGC component 1530, an LNA management component 1535, a transceiver management component 1540, or any combination thereof. The communications manager 1520 may be an example of aspects of a communications manager 1420 as described herein. In some examples, the communications manager 1520, or various components thereof, may be configured to perform various operations (e.g., receiving, monitoring, transmitting) using or otherwise in cooperation with the receiver 1510, the transmitter 1515, or both. For example, the communications manager 1520 may receive information from the receiver 1510, send information to the transmitter 1515, or be integrated in combination with the receiver 1510, the transmitter 1515, or both to receive information, transmit information, or perform various other operations as described herein.

The communications manager 1520 may support wireless communication at a UE in accordance with examples as disclosed herein. The antenna component 1525 may be configured as or otherwise support a means for receiving, via an antenna of the UE, a first signal associated with a first network subscription on a first receive path of the antenna and a second signal associated with a second network subscription on a second receive path of the antenna. The AGC component 1530 may be configured as or otherwise support a means for determining a first GS associated with the first network subscription based on a signal strength of the first signal. The LNA management component 1535 may be configured as or otherwise support a means for setting a first gain for a LNA that is coupled with the antenna based on the first GS, where the LNA is shared between first signaling associated with the first network subscription and second signaling associated with the second network subscription.

The AGC component 1530 may be configured as or otherwise support a means for determining a second GS associated with the second network subscription based on a signal strength of the second signal and the first gain for the LNA. The transceiver management component 1540 may be configured as or otherwise support a means for setting a first receive GS for the first receive path of the antenna associated with the first network subscription based on the first GS. The transceiver management component 1540 may be configured as or otherwise support a means for setting a second receive GS for the second receive path of the antenna associated with the second network subscription based on the second GS.

Figure 16:
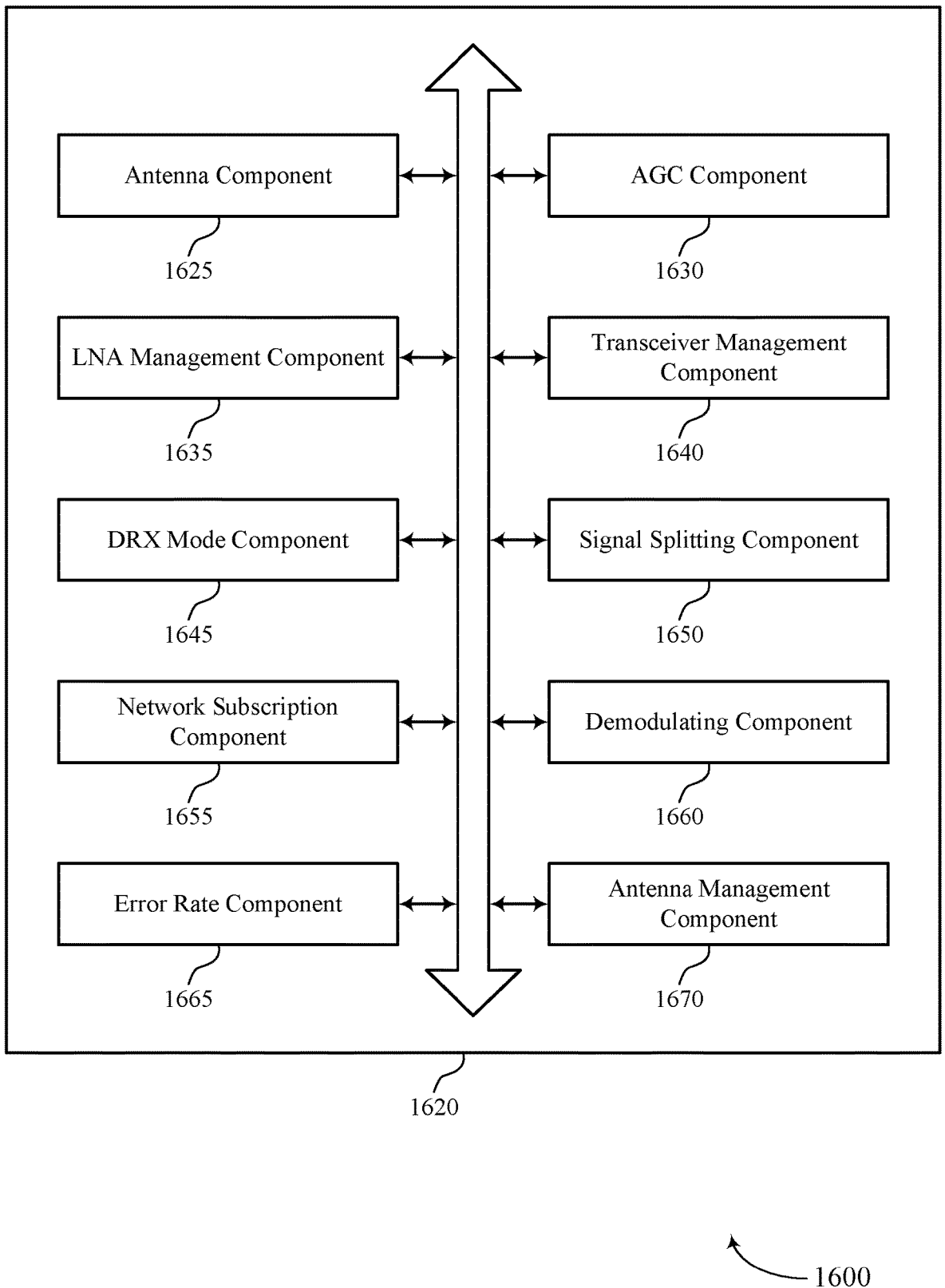
FIG. 16 shows a block diagram of a communications manager that supports techniques for managing a shared LNA AGC in DSDA deployments in accordance with various aspects of the present disclosure.

FIG. 16 shows a block diagram 1600 of a communications manager 1620 that supports techniques for managing a shared LNA AGC in DSDA deployments in accordance with various aspects of the present disclosure. The communications manager 1620 may be an example of aspects of a communications manager 1420, a communications manager 1520, or both, as described herein. The communications manager 1620, or various components thereof, may be an example of means for performing various aspects of techniques for managing a shared LNA AGC in DSDA deployments as described herein. For example, the communications manager 1620 may include an antenna component 1625, an AGC component 1630, an LNA management component 1635, a transceiver management component 1640, a DRx mode component 1645, a signal splitting component 1650, a network subscription component 1655, a demodulating component 1660, an error rate component 1665, an antenna management component 1670, or any combination thereof. Each of these components may communicate, directly or indirectly, with one another (e.g., via one or more buses).

The communications manager 1620 may support wireless communication at a UE in accordance with examples as disclosed herein. The antenna component 1625 may be configured as or otherwise support a means for receiving, via an antenna of the UE, a first signal associated with a first network subscription on a first receive path of the antenna and a second signal associated with a second network subscription on a second receive path of the antenna. The AGC component 1630 may be configured as or otherwise support a means for determining a first GS associated with the first network subscription based on a signal strength of the first signal. The LNA management component 1635 may be configured as or otherwise support a means for setting a first gain for a LNA that is coupled with the antenna based on the first GS, where the LNA is shared between first signaling associated with the first network subscription and second signaling associated with the second network subscription.

In some examples, the AGC component 1630 may be configured as or otherwise support a means for determining a second GS associated with the second network subscription based on a signal strength of the second signal and the first gain for the LNA. The transceiver management component 1640 may be configured as or otherwise support a means for setting a first receive GS for the first receive path of the antenna associated with the first network subscription based on the first GS. In some examples, the transceiver management component 1640 may be configured as or otherwise support a means for setting a second receive GS for the second receive path of the antenna associated with the second network subscription based on the second GS.

In some examples, to support receiving the first signal associated with the first network subscription on the first receive path of the antenna and the second signal associated with the second network subscription on the second receive path of the antenna, the antenna component 1625 may be configured as or otherwise support a means for receiving the first signal and the second signal over an at least partially overlapping set of time and frequency resources.

In some examples, to support setting the first gain for the LNA, the transceiver management component 1640 may be configured as or otherwise support a means for inputting, into a transceiver unit of the UE, the first GS associated with the first signal. In some examples, to support setting the first gain for the LNA, the transceiver management component 1640 may be configured as or otherwise support a means for determining, as an output of the transceiver unit, the first gain for the LNA based on inputting the first GS associated with the first signal.

In some examples, to support receiving the first signal associated with the first network subscription on the first receive path of the antenna and the second signal associated with the second network subscription on the second receive path of the antenna, the antenna component 1625 may be configured as or otherwise support a means for receiving, via a set of antennas including the antenna, the first signal and the second signal.

In some examples, the error rate component 1665 may be configured as or otherwise support a means for detecting that an error rate associated with the second signal fails to satisfy a threshold error rate for a threshold time duration. In some examples, the antenna management component 1670 may be configured as or otherwise support a means for dropping the receiving of the first signal from receiving the first signal via the set of antennas to receiving the first signal via a first subset of one or more antennas. In some examples, the antenna management component 1670 may be configured as or otherwise support a means for dropping the receiving of the second signal from receiving the second signal via the set of antennas to receiving the second signal via a second subset of one or more antennas different from the first subset of one or more antennas, where the set of antennas includes the first subset of one or more antennas and the second subset of one or more antennas.

In some examples, the LNA management component 1635 may be configured as or otherwise support a means for setting a gain for each of one or more LNAs coupled with the first subset of one or more antennas based on the first signaling associated with the first network subscription. In some examples, the LNA management component 1635 may be configured as or otherwise support a means for setting a gain for each of one or more LNAs coupled with the second subset of one or more antennas based on the second signaling associated with the second network subscription.

In some examples, the transceiver management component 1640 may be configured as or otherwise support a means for blanking one or more receive paths of the first subset of one or more antennas associated with the second network subscription. In some examples, the transceiver management component 1640 may be configured as or otherwise support a means for blanking one or more receive paths of the second subset of one or more antennas associated with the first network subscription.

In some examples, the transceiver management component 1640 may be configured as or otherwise support a means for tuning one or more receive paths of the first subset of one or more antennas associated with the second network subscription away from the second signaling associated with the second network subscription. In some examples, the transceiver management component 1640 may be configured as or otherwise support a means for tuning one or more receive paths of the second subset of one or more antennas associated with the first network subscription away from the first signaling associated with the first network subscription.

In some examples, the error rate component 1665 may be configured as or otherwise support a means for detecting that the error rate associated with the second signal satisfies the threshold error rate. In some examples, the antenna management component 1670 may be configured as or otherwise support a means for returning the receiving of the first signal from receiving the first signal via the first subset of one or more antennas to receiving the first signal via the set of antennas. In some examples, the antenna management component 1670 may be configured as or otherwise support a means for returning the receiving of the second signal from receiving the second signal via the second subset of one or more antennas to receiving the second signal via the set of antennas.

In some examples, the DRx mode component 1645 may be configured as or otherwise support a means for detecting that the first network subscription enters a short DRx mode. In some examples, the LNA management component 1635 may be configured as or otherwise support a means for maintaining the first gain for the LNA for a duration of the short DRx mode.

In some examples, the DRx mode component 1645 may be configured as or otherwise support a means for detecting that the first network subscription enters a long DRx mode. In some examples, the LNA management component 1635 may be configured as or otherwise support a means for setting a gain for the LNA based on the second signaling associated with the second network subscription for a duration of the long DRx mode.

In some examples, the signal splitting component 1650 may be configured as or otherwise support a means for splitting the first signal from the second signal based on receiving the first signal and the second signal via the antenna, where setting the first receive GS for the first receive path of the antenna and the second receive GS for the second receive path of the antenna is based on splitting the first signal from the second signal.

In some examples, to support splitting the first signal from the second signal, the signal splitting component 1650 may be configured as or otherwise support a means for splitting the first signal from the second signal external to a processing path of a wireless transceiver. In some examples, to support splitting the first signal from the second signal, the signal splitting component 1650 may be configured as or otherwise support a means for splitting the first signal from the second signal internal to the processing path of the wireless transceiver.

In some examples, the network subscription component 1655 may be configured as or otherwise support a means for setting the first network subscription as a priority network subscription based on a service type associated with the first network subscription, where setting the first gain for the LNA based on the first GS is based on setting the first network subscription as the priority network subscription.

In some examples, the demodulating component 1660 may be configured as or otherwise support a means for demodulating the first signal via the first receive path associated with the first network subscription based on the first receive GS. In some examples, the demodulating component 1660 may be configured as or otherwise support a means for demodulating the second signal via the second receive path associated with the second network subscription based on the second receive GS.

In some examples, the first GS associated with the first network subscription conveys information relating to a first automatic gain control resolution for the first receive path. In some examples, the second GS associated with the second network subscription conveys information relating to a second automatic gain control resolution for the second receive path. In some examples, the UE includes a mobile DSDA UE.

Figure 17:
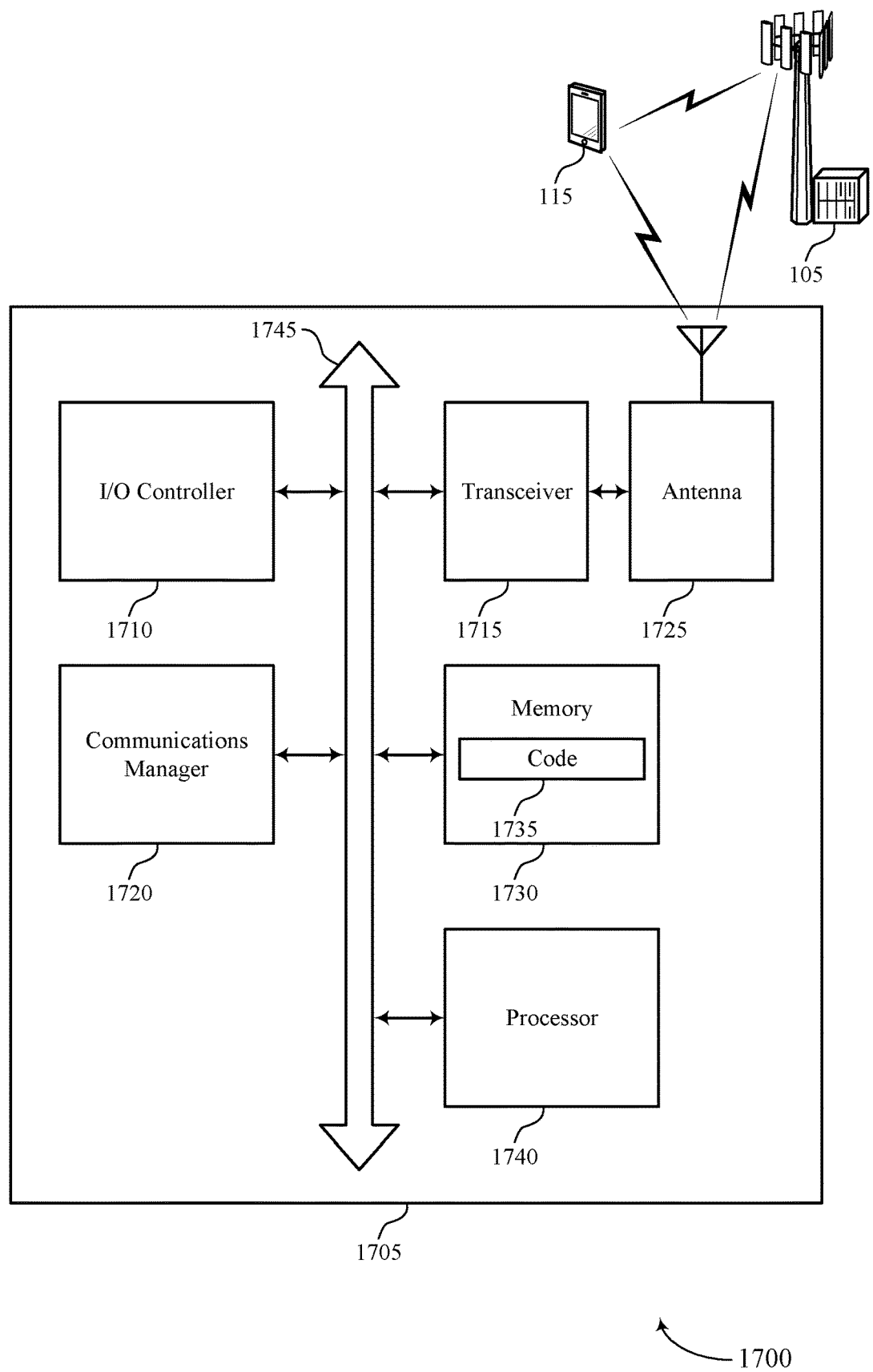
FIG. 17 shows a diagram of a system including a device that supports techniques for managing a shared LNA AGC in DSDA deployments in accordance with various aspects of the present disclosure.

FIG. 17 shows a diagram of a system 1700 including a device 1705 that supports techniques for managing a shared LNA AGC in DSDA deployments in accordance with various aspects of the present disclosure. The device 1705 may be an example of or include the components of a device 1405, a device 1505, or a UE 115 as described herein. The device 1705 may communicate wirelessly with one or more base stations 105, UEs 115, or any combination thereof. The device 1705 may include components for bi-directional voice and data communications including components for transmitting and receiving communications, such as a communications manager 1720, an input/output (I/O) controller 1710, a transceiver 1715, an antenna 1725, a memory 1730, code 1735, and a processor 1740. These components may be in electronic communication or otherwise coupled (e.g., operatively, communicatively, functionally, electronically, electrically) via one or more buses (e.g., a bus 1745).

The I/O controller 1710 may manage input and output signals for the device 1705. The I/O controller 1710 may also manage peripherals not integrated into the device 1705. In some cases, the I/O controller 1710 may represent a physical connection or port to an external peripheral. In some cases, the I/O controller 1710 may utilize an operating system such as iOS®, ANDROID®, MS-DOS®, MS-WINDOWS®, OS/2®, UNIX®, LINUX®, or another known operating system. Additionally or alternatively, the I/O controller 1710 may represent or interact with a modem, a keyboard, a mouse, a touchscreen, or a similar device. In some cases, the I/O controller 1710 may be implemented as part of a processor, such as the processor 1740. In some cases, a user may interact with the device 1705 via the I/O controller 1710 or via hardware components controlled by the I/O controller 1710.

In some cases, the device 1705 may include a single antenna 1725. However, in some other cases, the device 1705 may have more than one antenna 1725, which may be capable of concurrently transmitting or receiving multiple wireless transmissions. The transceiver 1715 may communicate bi-directionally, via the one or more antennas 1725, wired, or wireless links as described herein. For example, the transceiver 1715 may represent a wireless transceiver and may communicate bi-directionally with another wireless transceiver. The transceiver 1715 may also include a modem to modulate the packets, to provide the modulated packets to one or more antennas 1725 for transmission, and to demodulate packets received from the one or more antennas 1725. The transceiver 1715, or the transceiver 1715 and one or more antennas 1725, may be an example of a transmitter 1415, a transmitter 1515, a receiver 1410, a receiver 1510, or any combination thereof or component thereof, as described herein.

The memory 1730 may include random access memory (RAM) and read-only memory (ROM). The memory 1730 may store computer-readable, computer-executable code 1735 including instructions that, when executed by the processor 1740, cause the device 1705 to perform various functions described herein. The code 1735 may be stored in a non-transitory computer-readable medium such as system memory or another type of memory. In some cases, the code 1735 may not be directly executable by the processor 1740 but may cause a computer (e.g., when compiled and executed) to perform functions described herein. In some cases, the memory 1730 may contain, among other things, a basic I/O system (BIOS) which may control basic hardware or software operation such as the interaction with peripheral components or devices.

The processor 1740 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof).

In some cases, the processor 1740 may be configured to operate a memory array using a memory controller. In some other cases, a memory controller may be integrated into the processor 1740. The processor 1740 may be configured to execute computer-readable instructions stored in a memory (e.g., the memory 1730) to cause the device 1705 to perform various functions (e.g., functions or tasks supporting techniques for managing a shared LNA AGC in DSDA deployments). For example, the device 1705 or a component of the device 1705 may include a processor 1740 and memory 1730 coupled to the processor 1740, the processor 1740 and memory 1730 configured to perform various functions described herein.

The communications manager 1720 may support wireless communication at a UE in accordance with examples as disclosed herein. For example, the communications manager 1720 may be configured as or otherwise support a means for receiving, via an antenna of the UE, a first signal associated with a first network subscription on a first receive path of the antenna and a second signal associated with a second network subscription on a second receive path of the antenna. The communications manager 1720 may be configured as or otherwise support a means for determining a first GS associated with the first network subscription based on a signal strength of the first signal. The communications manager 1720 may be configured as or otherwise support a means for setting a first gain for a LNA that is coupled with the antenna based on the first GS, where the LNA is shared between first signaling associated with the first network subscription and second signaling associated with the second network subscription.

The communications manager 1720 may be configured as or otherwise support a means for determining a second GS associated with the second network subscription based on a signal strength of the second signal and the first gain for the LNA. The communications manager 1720 may be configured as or otherwise support a means for setting a first receive GS for the first receive path of the antenna associated with the first network subscription based on the first GS. The communications manager 1720 may be configured as or otherwise support a means for setting a second receive GS for the second receive path of the antenna associated with the second network subscription based on the second GS.

By including or configuring the communications manager 1720 in accordance with examples as described herein, the device 1705 may support techniques for greater downlink coverage, greater throughput, improved user experience related to reduced processing, reduced power consumption, more efficient utilization of communication resources, longer battery life, and improved utilization of processing capability.

In some examples, the communications manager 1720 may be configured to perform various operations (e.g., receiving, monitoring, transmitting) using or otherwise in cooperation with the transceiver 1715, the one or more antennas 1725, or any combination thereof. Although the communications manager 1720 is illustrated as a separate component, in some examples, one or more functions described with reference to the communications manager 1720 may be supported by or performed by the processor 1740, the memory 1730, the code 1735, or any combination thereof. For example, the code 1735 may include instructions executable by the processor 1740 to cause the device 1705 to perform various aspects of techniques for managing a shared LNA AGC in DSDA deployments as described herein, or the processor 1740 and the memory 1730 may be otherwise configured to perform or support such operations.

Figure 18:
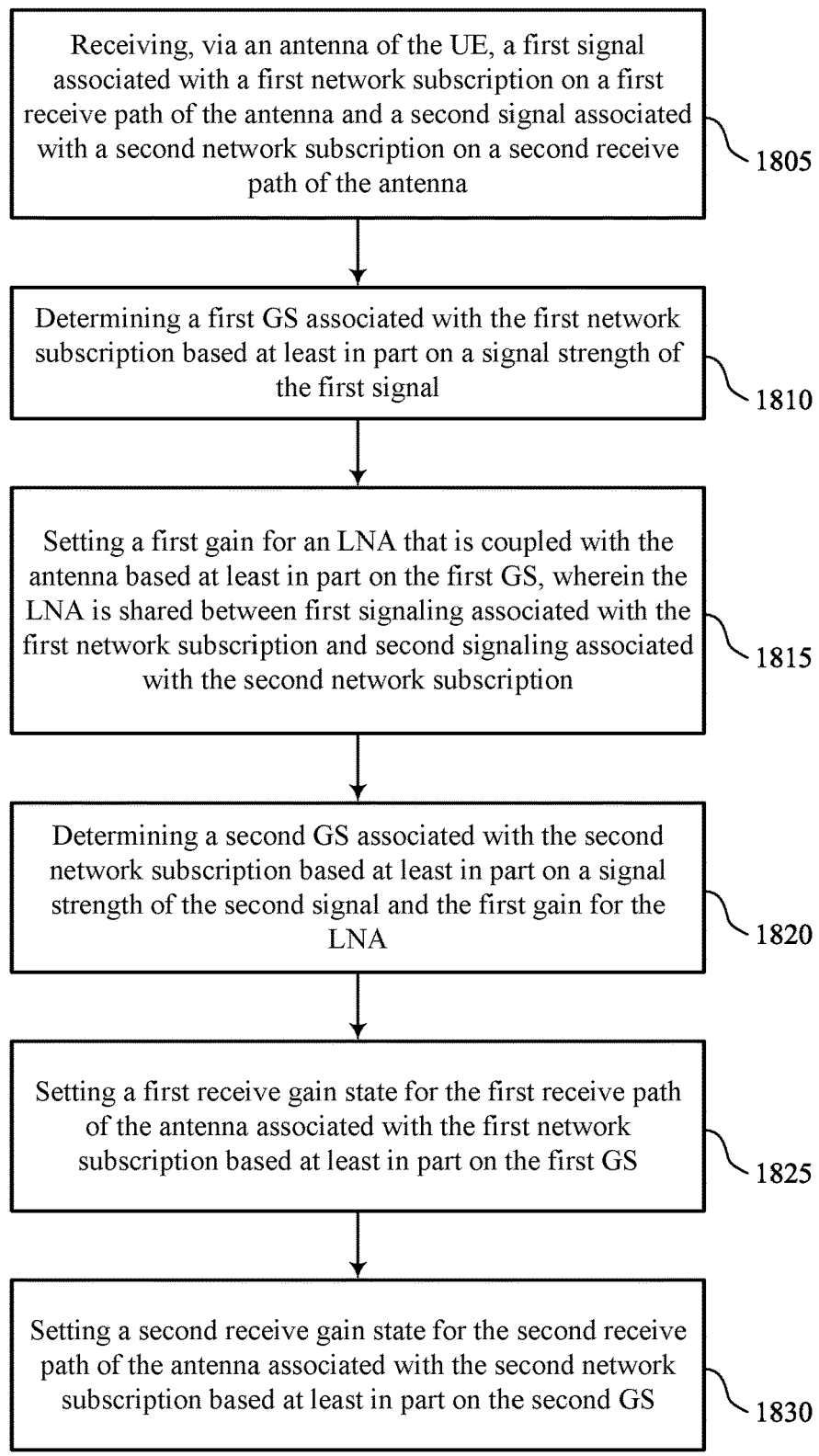
FIG. 18 shows a flowchart illustrating methods that support techniques for managing a shared LNA AGC in DSDA deployments in accordance with various aspects of the present disclosure.

FIG. 18 shows a flowchart illustrating a method 1800 that supports techniques for managing a shared LNA AGC in DSDA deployments in accordance with various aspects of the present disclosure. The operations of the method 1800 may be implemented by a UE or its components as described herein. For example, the operations of the method 1800 may be performed by a UE 115 as described with reference to FIGS. 1 through 17. In some examples, a UE may execute a set of instructions to control the functional elements of the UE to perform the functions of the present disclosure. Additionally or alternatively, the UE may perform aspects of the functions of the present disclosure using special-purpose hardware.

At 1805, the method may include receiving, via an antenna of the UE, a first signal associated with a first network subscription on a first receive path of the antenna and a second signal associated with a second network subscription on a second receive path of the antenna. The operations of 1805 may be performed in accordance with examples as disclosed herein. In some examples, aspects of the operations of 1805 may be performed by an antenna component 1625 as described with reference to FIG. 16.

At 1810, the method may include determining a first GS associated with the first network subscription based on a signal strength of the first signal. The operations of 1810 may be performed in accordance with examples as disclosed herein. In some examples, aspects of the operations of 1810 may be performed by an AGC component 1630 as described with reference to FIG. 16.

At 1815, the method may include setting a first gain for an LNA that is coupled with the antenna based on the first GS, where the LNA is shared between first signaling associated with the first network subscription and second signaling associated with the second network subscription. The operations of 1815 may be performed in accordance with examples as disclosed herein. In some examples, aspects of the operations of 1815 may be performed by an LNA management component 1635 as described with reference to FIG. 16.

At 1820, the method may include determining a second GS associated with the second network subscription based on a signal strength of the second signal and the first gain for the LNA. The operations of 1820 may be performed in accordance with examples as disclosed herein. In some examples, aspects of the operations of 1820 may be performed by an AGC component 1630 as described with reference to FIG. 16.

At 1825, the method may include setting a first receive GS for the first receive path of the antenna associated with the first network subscription based on the first GS. The operations of 1825 may be performed in accordance with examples as disclosed herein. In some examples, aspects of the operations of 1825 may be performed by a transceiver management component 1640 as described with reference to FIG. 16.

At 1830, the method may include setting a second receive GS for the second receive path of the antenna associated with the second network subscription based on the second GS. The operations of 1830 may be performed in accordance with examples as disclosed herein. In some examples, aspects of the operations of 1830 may be performed by a transceiver management component 1640 as described with reference to FIG. 16.

The following provides an overview of aspects of the present disclosure:

Aspect 1: A method for wireless communication at a UE, comprising: receiving, via an antenna of the UE, a first signal associated with a first network subscription on a first receive path of the antenna and a second signal associated with a second network subscription on a second receive path of the antenna; determining a first GS associated with the first network subscription based at least in part on a signal strength of the first signal; setting a first gain for a LNA that is coupled with the antenna based at least in part on the first GS, wherein the LNA is shared between first signaling associated with the first network subscription and second signaling associated with the second network subscription; determining a second GS associated with the second network subscription based at least in part on a signal strength of the second signal and the first gain for the LNA; setting a first receive GS for the first receive path of the antenna associated with the first network subscription based at least in part on the first GS; and setting a second receive GS for the second receive path of the antenna associated with the second network subscription based at least in part on the second GS.

Aspect 2: The method of aspect 1, wherein receiving the first signal associated with the first network subscription on the first receive path of the antenna and the second signal associated with the second network subscription on the second receive path of the antenna comprises: receiving the first signal and the second signal over an at least partially overlapping set of time and frequency resources.

Aspect 3: The method of any of aspects 1 or 2, wherein setting the first gain for the LNA comprises: inputting, into a transceiver unit of the UE, the first GS associated with the first signal; and determining, as an output of the transceiver unit, the first gain for the LNA based at least in part on inputting the first GS associated with the first signal.

Aspect 4: The method of any of aspects 1 through 3, wherein receiving the first signal associated with the first network subscription on the first receive path of the antenna and the second signal associated with the second network subscription on the second receive path of the antenna comprises: receiving, via a set of antennas including the antenna, the first signal and the second signal.

Aspect 5: The method of aspect 4, further comprising: detecting that an error rate associated with the second signal fails to satisfy a threshold error rate for a threshold time duration; dropping the receiving of the first signal from receiving the first signal via the set of antennas to receiving the first signal via a first subset of one or more antennas; and dropping the receiving of the second signal from receiving the second signal via the set of antennas to receiving the second signal via a second subset of one or more antennas different from the first subset of one or more antennas, wherein the set of antennas comprises the first subset of one or more antennas and the second subset of one or more antennas.

Aspect 6: The method of aspect 5, further comprising: setting a gain for each of one or more LNAs coupled with the first subset of one or more antennas based at least in part on the first signaling associated with the first network subscription; and setting a gain for each of one or more LNAs coupled with the second subset of one or more antennas based at least in part on the second signaling associated with the second network subscription.

Aspect 7: The method of any of aspects 5 or 6, further comprising: blanking one or more receive paths of the first subset of one or more antennas associated with the second network subscription; and blanking one or more receive paths of the second subset of one or more antennas associated with the first network subscription.

Aspect 8: The method of any of aspects 5 or 6, further comprising: tuning one or more receive paths of the first subset of one or more antennas associated with the second network subscription away from the second signaling associated with the second network subscription; and tuning one or more receive paths of the second subset of one or more antennas associated with the first network subscription away from the first signaling associated with the first network subscription.

Aspect 9: The method of any of aspects 5 through 8, further comprising: detecting that the error rate associated with the second signal satisfies the threshold error rate; returning the receiving of the first signal from receiving the first signal via the first subset of one or more antennas to receiving the first signal via the set of antennas; and returning the receiving of the second signal from receiving the second signal via the second subset of one or more antennas to receiving the second signal via the set of antennas.

Aspect 10: The method of any of aspects 1 through 9, further comprising: detecting that the first network subscription enters a short DRx mode; and maintaining the first gain for the LNA for a duration of the short DRx mode.

Aspect 11: The method of any of aspects 1 through 9, further comprising: detecting that the first network subscription enters a long DRx mode; and setting a gain for the LNA based at least in part on the second signaling associated with the second network subscription for a duration of the long DRx mode.

Aspect 12: The method of any of aspects 1 through 11, further comprising: splitting the first signal from the second signal based at least in part on receiving the first signal and the second signal via the antenna, wherein setting the first receive GS for the first receive path of the antenna and the second receive GS for the second receive path of the antenna is based at least in part on splitting the first signal from the second signal.

Aspect 13: The method of aspect 12, wherein splitting the first signal from the second signal comprises: splitting the first signal from the second signal external to a processing path of a wireless transceiver; or splitting the first signal from the second signal internal to the processing path of the wireless transceiver.

Aspect 14: The method of any of aspects 1 through 13, further comprising: setting the first network subscription as a priority network subscription based at least in part on a service type associated with the first network subscription, wherein setting the first gain for the LNA based at least in part on the first GS is based at least in part on setting the first network subscription as the priority network subscription.

Aspect 15: The method of any of aspects 1 through 14, further comprising: demodulating the first signal via the first receive path associated with the first network subscription based at least in part on the first receive GS; and demodulating the second signal via the second receive path associated with the second network subscription based at least in part on the second receive GS.

Aspect 16: The method of any of aspects 1 through 15, wherein the first GS associated with the first network subscription conveys information relating to a first AGC resolution for the first receive path; and the second GS associated with the second network subscription conveys information relating to a second AGC resolution for the second receive path.

Aspect 17: The method of any of aspects 1 through 16, wherein the UE comprises a mobile DSDA UE.

Aspect 18: An apparatus for wireless communication at a UE, comprising a processor; memory coupled with the processor; and instructions stored in the memory and executable by the processor to cause the apparatus to perform a method of any of aspects 1 through 17.

Aspect 19: An apparatus for wireless communication at a UE, comprising at least one means for performing a method of any of aspects 1 through 17.

Aspect 20: A non-transitory computer-readable medium storing code for wireless communication at a UE, the code comprising instructions executable by a processor to perform a method of any of aspects 1 through 17.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the present disclosure may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes examples and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of example techniques for implementing various aspects of the present disclosure. These techniques, however, may be practiced without these specific details. In some instances, known structures and devices are shown in block diagram form in order to avoid obscuring the concepts of the examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication at a user equipment (UE), comprising:
   receiving, via an antenna of the UE, a first signal associated with a first network subscription on a first receive path of the antenna and a second signal associated with a second network subscription on a second receive path of the antenna;
   determining a first gain state associated with the first network subscription based at least in part on a signal strength of the first signal;
   setting a first gain for a low noise amplifier that is coupled with the antenna based at least in part on the first gain state, wherein the low noise amplifier is shared between first signaling associated with the first network subscription and second signaling associated with the second network subscription;
   determining a second gain state associated with the second network subscription based at least in part on a signal strength of the second signal and the first gain for the low noise amplifier;
   setting a first receive gain state for the first receive path of the antenna associated with the first network subscription based at least in part on the first gain state; and
   setting a second receive gain state for the second receive path of the antenna associated with the second network subscription based at least in part on the second gain state.

2. The method of claim 1, wherein receiving the first signal associated with the first network subscription on the first receive path of the antenna and the second signal associated with the second network subscription on the second receive path of the antenna comprises:
   receiving the first signal and the second signal over an at least partially overlapping set of time and frequency resources.

3. The method of claim 1, wherein setting the first gain for the low noise amplifier comprises:
   inputting, into a transceiver unit of the UE, the first gain state associated with the first signal; and
   determining, as an output of the transceiver unit, the first gain for the low noise amplifier based at least in part on inputting the first gain state associated with the first signal.

4. The method of claim 1, wherein receiving the first signal associated with the first network subscription on the first receive path of the antenna and the second signal associated with the second network subscription on the second receive path of the antenna comprises:
   receiving, via a set of antennas including the antenna, the first signal and the second signal.

5. The method of claim 4, further comprising:
   detecting that an error rate associated with the second signal fails to satisfy a threshold error rate for a threshold time duration;
   dropping the receiving of the first signal from receiving the first signal via the set of antennas to receiving the first signal via a first subset of one or more antennas; and
   dropping the receiving of the second signal from receiving the second signal via the set of antennas to receiving the second signal via a second subset of one or more antennas different from the first subset of one or more antennas, wherein the set of antennas comprises the first subset of one or more antennas and the second subset of one or more antennas.

6. The method of claim 5, further comprising:
   setting a gain for each of one or more low noise amplifiers coupled with the first subset of one or more antennas based at least in part on the first signaling associated with the first network subscription; and
   setting a gain for each of one or more low noise amplifiers coupled with the second subset of one or more antennas based at least in part on the second signaling associated with the second network subscription.

7. The method of claim 5, further comprising:
   blanking one or more receive paths of the first subset of one or more antennas associated with the second network subscription; and
   blanking one or more receive paths of the second subset of one or more antennas associated with the first network subscription.

8. The method of claim 5, further comprising:
   tuning one or more receive paths of the first subset of one or more antennas associated with the second network subscription away from the second signaling associated with the second network subscription; and
   tuning one or more receive paths of the second subset of one or more antennas associated with the first network subscription away from the first signaling associated with the first network subscription.

9. The method of claim 5, further comprising:
   detecting that the error rate associated with the second signal satisfies the threshold error rate;
   returning the receiving of the first signal from receiving the first signal via the first subset of one or more antennas to receiving the first signal via the set of antennas; and
   returning the receiving of the second signal from receiving the second signal via the second subset of one or more antennas to receiving the second signal via the set of antennas.

10. The method of claim 1, further comprising:
    detecting that the first network subscription enters a short discontinuous reception mode; and
    maintaining the first gain for the low noise amplifier for a duration of the short discontinuous reception mode.

11. The method of claim 1, further comprising:
    detecting that the first network subscription enters a long discontinuous reception mode; and
    setting a gain for the low noise amplifier based at least in part on the second signaling associated with the second network subscription for a duration of the long discontinuous reception mode.

12. The method of claim 1, further comprising:
    splitting the first signal from the second signal based at least in part on receiving the first signal and the second signal via the antenna, wherein setting the first receive gain state for the first receive path of the antenna and the second receive gain state for the second receive path of the antenna is based at least in part on splitting the first signal from the second signal.

13. The method of claim 12, wherein splitting the first signal from the second signal comprises:
splitting the first signal from the second signal external to a processing path of a wireless transceiver; or
splitting the first signal from the second signal internal to the processing path of the wireless transceiver.

14. The method of claim 1, further comprising:
setting the first network subscription as a priority network subscription based at least in part on a service type associated with the first network subscription, wherein setting the first gain for the low noise amplifier based at least in part on the first gain state is based at least in part on setting the first network subscription as the priority network subscription.

15. The method of claim 1, further comprising:
demodulating the first signal via the first receive path associated with the first network subscription based at least in part on the first receive gain state; and
demodulating the second signal via the second receive path associated with the second network subscription based at least in part on the second receive gain state.

16. The method of claim 1, wherein:
the first gain state associated with the first network subscription conveys information relating to a first automatic gain control resolution for the first receive path; and
the second gain state associated with the second network subscription conveys information relating to a second automatic gain control resolution for the second receive path.

17. The method of claim 1, wherein the UE comprises a mobile dual subscriber identity module (SIM) dual active UE.

18. An apparatus for wireless communication at a user equipment (UE), comprising:
a processor;
memory coupled with the processor; and
instructions stored in the memory and executable by the processor to cause the apparatus to:
receive, via an antenna of the UE, a first signal associated with a first network subscription on a first receive path of the antenna and a second signal associated with a second network subscription on a second receive path of the antenna;
determine a first gain state associated with the first network subscription based at least in part on a signal strength of the first signal;
set a first gain for a low noise amplifier that is coupled with the antenna based at least in part on the first gain state, wherein the low noise amplifier is shared between first signaling associated with the first network subscription and second signaling associated with the second network subscription;
determine a second gain state associated with the second network subscription based at least in part on a signal strength of the second signal and the first gain for the low noise amplifier;
set a first receive gain state for the first receive path of the antenna associated with the first network subscription based at least in part on the first gain state; and set a second receive gain state for the second receive path of the antenna associated with the second network subscription based at least in part on the second gain state.

19. The apparatus of claim 18, wherein the instructions to receive the first signal associated with the first network subscription on the first receive path of the antenna and the second signal associated with the second network subscription on the second receive path of the antenna are executable by the processor to cause the apparatus to:
receive the first signal and the second signal over an at least partially overlapping set of time and frequency resources.

20. The apparatus of claim 18, wherein the instructions to set the first gain for the low noise amplifier are executable by the processor to cause the apparatus to:
input, into a transceiver unit of the UE, the first gain state associated with the first signal; and
determine, as an output of the transceiver unit, the first gain for the low noise amplifier based at least in part on inputting the first gain state associated with the first signal.

21. The apparatus of claim 18, wherein the instructions to receive the first signal associated with the first network subscription on the first receive path of the antenna and the second signal associated with the second network subscription on the second receive path of the antenna are executable by the processor to cause the apparatus to:
receive, via a set of antennas including the antenna, the first signal and the second signal.

22. The apparatus of claim 21, wherein the instructions are further executable by the processor to cause the apparatus to:
detect that an error rate associated with the second signal fails to satisfy a threshold error rate for a threshold time duration;
drop the receiving of the first signal from receiving the first signal via the set of antennas to receiving the first signal via a first subset of one or more antennas; and
drop the receiving of the second signal from receiving the second signal via the set of antennas to receiving the second signal via a second subset of one or more antennas different from the first subset of one or more antennas, wherein the set of antennas comprises the first subset of one or more antennas and the second subset of one or more antennas.

23. The apparatus of claim 22, wherein the instructions are further executable by the processor to cause the apparatus to:
set a gain for each of one or more low noise amplifiers coupled with the first subset of one or more antennas based at least in part on the first signaling associated with the first network subscription; and
set a gain for each of one or more low noise amplifiers coupled with the second subset of one or more antennas based at least in part on the second signaling associated with the second network subscription.

24. The apparatus of claim 22, wherein the instructions are further executable by the processor to cause the apparatus to:
blank one or more receive paths of the first subset of one or more antennas associated with the second network subscription; and
blank one or more receive paths of the second subset of one or more antennas associated with the first network subscription.

25. The apparatus of claim 22, wherein the instructions are further executable by the processor to cause the apparatus to:
- tune one or more receive paths of the first subset of one or more antennas associated with the second network subscription away from the second signaling associated with the second network subscription; and
- tune one or more receive paths of the second subset of one or more antennas associated with the first network subscription away from the first signaling associated with the first network subscription.

26. The apparatus of claim 22, wherein the instructions are further executable by the processor to cause the apparatus to:
- detect that the error rate associated with the second signal satisfies the threshold error rate;
- return the receiving of the first signal from receiving the first signal via the first subset of one or more antennas to receiving the first signal via the set of antennas; and
- return the receiving of the second signal from receiving the second signal via the second subset of one or more antennas to receiving the second signal via the set of antennas.

27. The apparatus of claim 18, wherein the instructions are further executable by the processor to cause the apparatus to:
- detect that the first network subscription enters a short discontinuous reception mode; and
- maintain the first gain for the low noise amplifier for a duration of the short discontinuous reception mode.

28. The apparatus of claim 18, wherein the instructions are further executable by the processor to cause the apparatus to:
- detect that the first network subscription enters a long discontinuous reception mode; and
- set a gain for the low noise amplifier based at least in part on the second signaling associated with the second network subscription for a duration of the long discontinuous reception mode.

29. An apparatus for wireless communication at a user equipment (UE), comprising:
- means for receiving, via an antenna of the UE, a first signal associated with a first network subscription on a first receive path of the antenna and a second signal associated with a second network subscription on a second receive path of the antenna;
- means for determining a first gain state associated with the first network subscription based at least in part on a signal strength of the first signal;
- means for setting a first gain for a low noise amplifier that is coupled with the antenna based at least in part on the first gain state, wherein the low noise amplifier is shared between first signaling associated with the first network subscription and second signaling associated with the second network subscription;
- means for determining a second gain state associated with the second network subscription based at least in part on a signal strength of the second signal and the first gain for the low noise amplifier;
- means for setting a first receive gain state for the first receive path of the antenna associated with the first network subscription based at least in part on the first gain state; and
- means for setting a second receive gain state for the second receive path of the antenna associated with the second network subscription based at least in part on the second gain state.

30. A non-transitory computer-readable medium storing code for wireless communication at a user equipment (UE), the code comprising instructions executable by a processor to:
- receive, via an antenna of the UE, a first signal associated with a first network subscription on a first receive path of the antenna and a second signal associated with a second network subscription on a second receive path of the antenna;
- determine a first gain state associated with the first network subscription based at least in part on a signal strength of the first signal;
- set a first gain for a low noise amplifier that is coupled with the antenna based at least in part on the first gain state, wherein the low noise amplifier is shared between first signaling associated with the first network subscription and second signaling associated with the second network subscription;
- determine a second gain state associated with the second network subscription based at least in part on a signal strength of the second signal and the first gain for the low noise amplifier;
- set a first receive gain state for the first receive path of the antenna associated with the first network subscription based at least in part on the first gain state; and
- set a second receive gain state for the second receive path of the antenna associated with the second network subscription based at least in part on the second gain state.

* * * * *